(12) United States Patent
Bloom et al.

(10) Patent No.: US 6,219,015 B1
(45) Date of Patent: Apr. 17, 2001

(54) METHOD AND APPARATUS FOR USING AN ARRAY OF GRATING LIGHT VALVES TO PRODUCE MULTICOLOR OPTICAL IMAGES

(75) Inventors: David M. Bloom, Portola Valley; Andrew Huibers, Stanford, both of CA (US)

(73) Assignee: The Board of Directors of the Leland Stanford, Junior University, San Jose, CA (US)

( * ) Notice: Subject to any disclaimer, the term of this patent is extended or adjusted under 35 U.S.C. 154(b) by 0 days.

(21) Appl. No.: 08/591,231

(22) Filed: Jan. 18, 1996

Related U.S. Application Data

(60) Continuation-in-part of application No. 08/404,139, filed on Mar. 13, 1995, which is a division of application No. 08/062,688, filed on May 20, 1993, which is a continuation-in-part of application No. 07/876,078, filed on Apr. 28, 1992, now Pat. No. 5,311,360.

(51) Int. Cl.⁷ ...................................................... G09G 3/36
(52) U.S. Cl. .............................................................. 345/87
(58) Field of Search ............................... 345/100, 87, 88; 348/744, 750, 751, 752; 353/88, 89

(56) References Cited

U.S. PATENT DOCUMENTS

| | | | |
|---|---|---|---|
| 4,090,219 | * | 5/1978 | Ernstoff .................................... 358/59 |
| 4,751,509 | * | 6/1988 | Kubota et al. ........................ 350/347 |
| 5,035,473 | * | 7/1991 | Kuwayama et al. .................... 350/3.7 |
| 5,046,827 | * | 9/1991 | Frost et al. ............................... 359/54 |
| 5,089,903 | * | 2/1992 | Kuwayama et al. .................... 359/15 |

* cited by examiner

Primary Examiner—Richard A. Hjerpe
Assistant Examiner—Ronald Laneau
(74) Attorney, Agent, or Firm—Oppenheimer Wolff & Donnelly, LLP; Claude A. S. Hamrick

(57) ABSTRACT

A multicolor optical image-generating device comprised of an array of grating light valves (GLVs) organized to form light-modulating pixel units for spatially modulating incident rays of light. The pixel units are comprised of three subpixel components each including a plurality of elongated, equally spaced apart reflective grating elements arranged parallel to each other with their light-reflective surfaces also parallel to each other. Each subpixel component includes means for supporting the grating elements in relation to one another, and means for moving alternate elements relative to the other elements and between a first configuration wherein the component acts to reflect incident rays of light as a plane mirror, and a second configuration wherein the component diffracts the incident rays of light as they are reflected from the grating elements. The three subpixel components of each pixel unit are designed such that when red, green and blue light sources are trained on the array, colored light diffracted by particular subpixel components operating in the second configuration will be directed through a viewing aperture, and light simply reflected from particular subpixel components operating in the first configuration will not be directed through the viewing aperture.

56 Claims, 13 Drawing Sheets

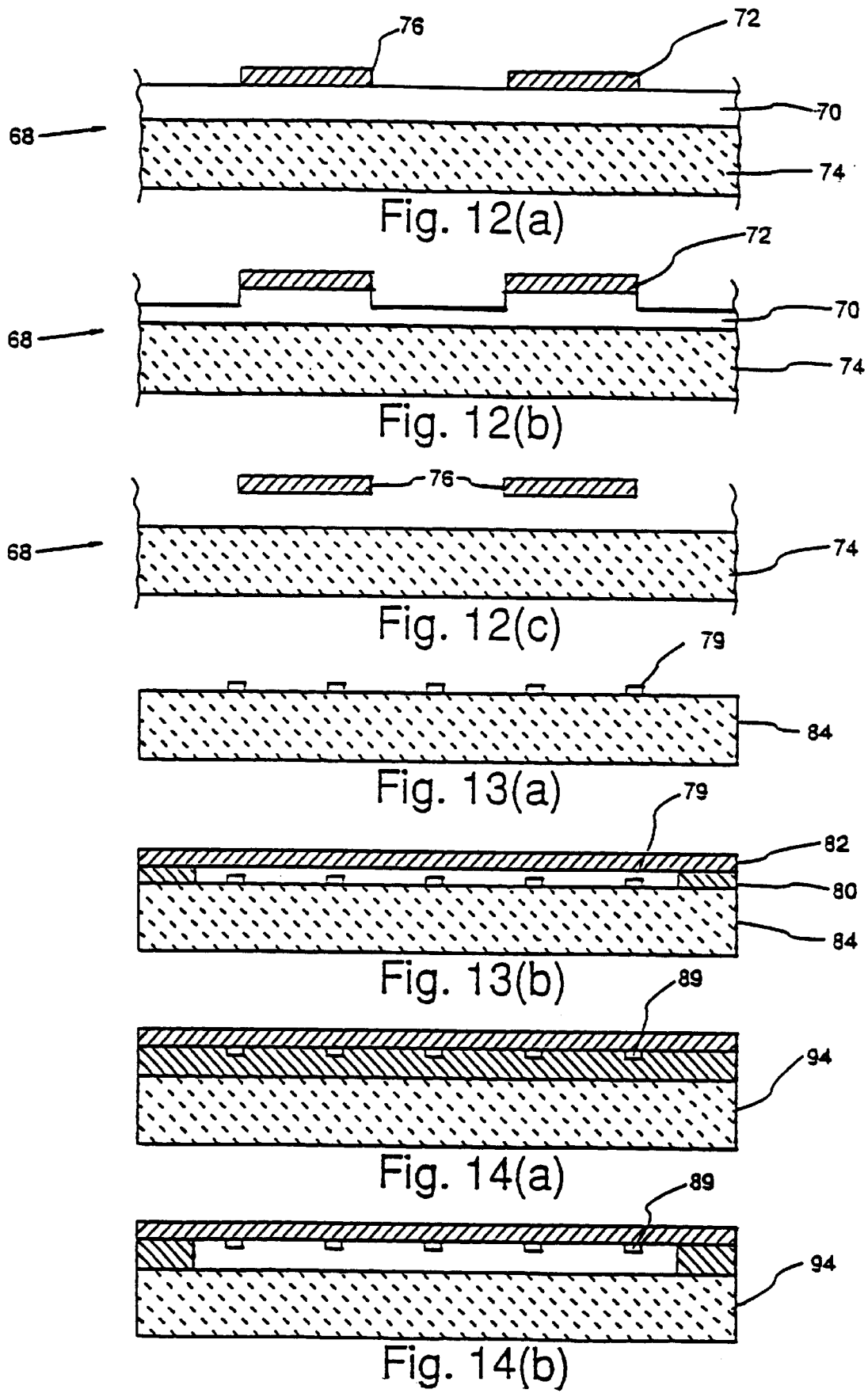

METHOD AND APPARATUS FOR USING AN ARRAY OF GRATING LIGHT VALVES TO PRODUCE MULTICOLOR OPTICAL IMAGES

RELATED CASES

This application is a continuation-in-part of U.S. patent application Ser. No. 08/404,139 filed on Mar. 13, 1995, which is a division of U.S. patent application Ser. No. 08/062,688 filed on May 20, 1993, which is a continuation-in-part of U.S. patent application Ser. No. 07/876,078 filed on Apr. 28, 1992 now U.S. Pat. No. 5,311,360.

This invention was made with Government support under contract DAAL03-88-K-0120 awarded by the U.S. Army Research Office. The Government has certain rights in this invention.

BACKGROUND OF THE INVENTION

1. Field of the Invention

This invention relates generally to display apparatus for producing optical images, and more particularly to a method and apparatus using an array of sets of grating light valves and a plurality of colored light sources to provide a multicolor image that can be directly viewed or projected onto a screen.

2. Brief Description of the Prior Art

Devices which modulate a light beam, e.g. by altering the amplitude, frequency or phase of the light, find a number of applications. An example of such a device is a spatial light modulator (SLM) which is an electronically or optically controlled device that consists of one or two-dimensional reconfigurable patterns of pixel elements, each of which can individually modulate the amplitude, phase or polarization of an optical wavefront.

These devices have been extensively developed, particularly for applications in the areas of optical processing and computing. They can perform a variety of functions such as: analog multiplication and addition, signal conversion (electrical-to-optical, incoherent-to-coherent, amplification, etc.), nonlinear operations and short term storage. Utilizing these functions, SLMs have seen many different applications from display technology to optical signal processing. For example, SLMs have been used as optical correlators (e.g., pattern recognition devices, programmable holograms), optical matrix processors (e.g., matrix multipliers, optical cross-bar switches with broadcast capabilities, optical neural networks, radar beam forming), digital optical architectures (e.g., highly parallel optical computers) and displays.

The requirements for SLM technology depend strongly on the application in mind: for example, a display requires low bandwidth but a high dynamic range while optical computers benefit from high response times but don't require such high dynamic ranges. Generally, systems designers require SLMs with characteristics such as: high resolution, high speed (kHz frame rates), good gray scale high contrast ratio or modulation depth, optical flatness, VLSI compatible, easy handling capability and low cost. To date, no one SLM design can satisfy all the above requirements. As a result, different types of SLMs have been developed for different applications, often resulting in trade-offs.

A color video imaging system utilizing a cathode ray device with a target comprising an array of electrostatically deflectable light valves is disclosed in U.S. Pat. No. 3,896,338 to Nathanson et al. The light valve structure and the arrangement of light valves as an array permits sequential activation of the light valves in response to a specific primary color video signal. The light valves are arranged in three element groupings, and a schlieren optical means is provided having respective primary color transmissive portions through which the light reflected from the deflected light valves is passed to permit projection of a color image upon a display screen.

Texas Instruments has developed a "Deformable Mirror Device (DMD)" that utilizes an electromechanical means of deflecting an optical beam. The mechanical motions needed for the operation of the DMD result in bandwidths limited to tens of kilohertz. However, this device generally provides better contrast ratios than the technologies previously described, provides acceptable "high resolution" and is compatible with conventional semiconductor processing techniques, such as CMOS.

Nematic and ferroelectric liquid crystals have also been used as the active layer in several SLMs. Since the electro-optic effect in liquid crystals is based on the mechanical reorientation of molecular dipoles, it is generally found that liquid crystals are faster than the DMD-type devices. Modulators using ferroelectric liquid crystals have exhibited moderate switching speeds (150 μsec to 100 nsec), low-power consumption, VLSI compatible switching voltages (5–10 V), high extinction ratios, high resolution and large apertures. However, these devices suffer from the drawbacks of limited liquid crystal lifetimes and operating temperature ranges. In addition, the manufacturing process is complicated by alignment problems and film thickness uniformity issues.

Magneto-optic modulation schemes have been used to achieve faster switching speeds and to provide an optical pattern memory cell. Although these devices, in addition to achieving fast switching speeds, can achieve large contrast ratios, they suffer from a low (<10%) throughput efficiency and are, therefore, often unsuitable for many applications.

The need is therefore for a light modulation device which overcomes these drawbacks.

Beside SLMs, another area of use of light modulators is in association with fiber optics apparatus. Fiber optic modulators are electronically controlled devices that modulate light intensity and are designed to be compatible with optical fibers. For high speed communication applications, lithium niobate ($LiNbO_3$) traveling wave modulators represent the state-of-the-art, but there is a need for low power, high efficiency, low loss, inexpensive fiber optic modulators, that can be integrated with silicon sensors and electronics, for data acquisition and medical applications. A typical use of a modulator combined with fiber optic technology, for example, is a data acquisition system on an airplane which consists of a central data processing unit that gathers data from remote sensors. Because of their lightweight and electro-magnetic immunity characteristics, fiber optics provide an ideal communication medium between the processor and the sensors which produce an electrical output that must be converted to an optical signal for transmission. The most efficient way to do this is to have a continuous wave laser at the processor and a modulator operating in reflection at the sensor. In this configuration, it is also possible to deliver power to the sensor over the fiber.

In this type of application the modulator should operate with high contrast and low insertion loss to maximize the signal to noise ratio and have low power consumption. It should further be compatible with silicon technology because the sensors and signal conditioning electronics used in these systems are largely implemented in silicon.

Another use of a modulator combined with fiber optic technology is in the monitoring of sensors that are surgically implanted in the human body. Here optical fibers are preferred to electrical cables because of their galvanic isolation, and any modulator used in these applications should exhibit high contrast combined with low insertion loss because of signal to noise considerations. Furthermore, as size is important in implanted devices, the modulator must be integratable with silicon sensors and electronics.

Modulators based on the electro-optic, Franz-Keldysh, Quantum-Confined-Stark or Wannier-Stark effect in III–V semiconductors have high contrast and low insertion loss, but are expensive and not compatible with silicon devices. Waveguide modulators employing glass or epi-layers on silicon, require too much area and too complex fabrication to be easily integratable with other silicon devices. Silicon modulators that do not employ waveguides and that are based on the plasma effect, require high electrical drive power and do not achieve high contrast.

A need therefore exists for improved light modulator apparatus having low power requirements, high efficiency, low loss, low cost and compatibility with silicon technology.

A need also exists for a multicolor display device using light modulator technology of the type described herein.

SUMMARY OF THE INVENTION

Objects of the Invention

An object of the present invention is thus to provide a novel display apparatus using grating light valve modulators that respond to electronic input signals and generate images that can be viewed directly or projected onto a viewing screen.

Another object of this invention is to provide a light-modulating display device that exhibits the following characteristics: high resolution, high speed (kHz frame rates), high contrast ratio or modulation depth, optical flatness, VLSI compatible, easy handling capability and low cost.

A further object of this invention is to provide a light-modulating, visual image-generating device that has a tolerance for high optical power and good optical throughput.

Another object of the present invention is to provide an optical display device using groupings of grating light valves as light-modulating, pixel-forming elements.

Yet another object of this invention is to provide a light modulator which is compatible with semiconductor processing.

Still another object of this invention is to provide a light modulator capable of use with fiber optic technology.

Yet another object of this invention is to provide a light modulator which is capable of modulating white light to produce colored light.

Summary

Briefly, a presently preferred embodiment of this invention includes a visual image-generating device comprised of an array of grating light valves (GLVs) organized to form light-modulating pixel units for spatially modulating incident rays of light. The pixel units are comprised of three subpixel components, each including a plurality of elongated, equally spaced apart reflective grating elements arranged parallel to each other with their light-reflective surfaces also parallel to each other. Each subpixel component includes means for supporting the grating elements in relation to one another wherein alternate elements are configured to be movable relative to other elements which are non-movable, and between a first configuration wherein the component acts to reflect incident rays of light as a plane mirror, and a second configuration wherein the component diffracts the incident rays of light as they are reflected from the grating elements. In operation, the light-reflective surfaces of the elements of each subpixel component remain parallel to each other in both the first and the second configurations, and the perpendicular spacing at rest between the planes of the reflective surfaces of adjacent elements is equal to m/4 times the wavelength of the incident rays of light, wherein m=an even whole number or zero when the elements are in the first configuration and m=an odd number when the elements are in the second configuration.

The three subpixel components of each pixel unit are designed such that when red, green and blue light sources are trained on the array, colored light diffracted by particular subpixel components operating in the second configuration will be directed through a viewing aperture, and light simply reflected from particular subpixel components operating in the first configuration will not be directed through the viewing aperture.

It will be appreciated by one of ordinary skill in the art that the fundamentals of the present invention can be similarly implemented by diffracting the light away from the viewing aperture and reflecting to the aperture.

One embodiment of the invention includes an array of deformable grating light valves with grating amplitudes that can be controlled electronically, and is comprised of a reflective substrate with a plurality of the deformable grating elements suspended above it. The deformable grating elements are implemented in silicon technology, using micromachining and sacrificial etching of thin films to fabricate the gratings. Typically the gratings are formed by lithographically etching a film made of silicon nitride, aluminum, silicon dioxide or any other material which can be lithographically etched. Circuitry for addressing and multiplexing the light valves is fabricated on the same silicon substrate and is thus directly integrated with the light-modulating mechanisms.

Direct integration with electronics provides an important advantage over non-silicon based technologies like liquid crystal oil-film light valves and electro-optic SLMs, because the device can be made smaller and with greater accuracy. Moreover, the device demonstrates simplicity of fabrication and can be manufactured with only a few lithographic steps.

A further advantage of the present invention is that since the grating light valves utilize diffraction rather than deflection of the light beam as the modulating mechanism, the required mechanical motions are reduced from several microns (as in deformable mirror devices) to tenths of a micron, thus allowing for a potential three orders of magnitude increase in operational speed over other SLM technology. This speed is comparable to the fastest liquid crystal modulators, but without the same complexity in the manufacturing process.

A still further advantage of the present invention is that it provides a miniature means for converting video data to an optical image that can be viewed directly, or can be projected onto a screen or film, or the data can be coupled into a fiberoptic cable for optical transmission to a remote location.

These and other objects and advantages of the present invention will no doubt become apparent to those skilled in the art after having read the following detailed description of the preferred embodiment which is illustrated in the several figures of the drawing.

IN THE DRAWING

FIG. 1 is an isometric, partially cut-away view of a single grating light valve or modulator;

FIGS. 2(a)–(d) are cross-sections through a silicon substrate illustrating the manufacturing process of the modulator illustrated in FIG. 1;

FIGS. 12a to 20 are sections illustrating further embodiments of the modulator;

DESCRIPTION OF PREFERRED EMBODIMENTS

First Embodiment

Figure 1:
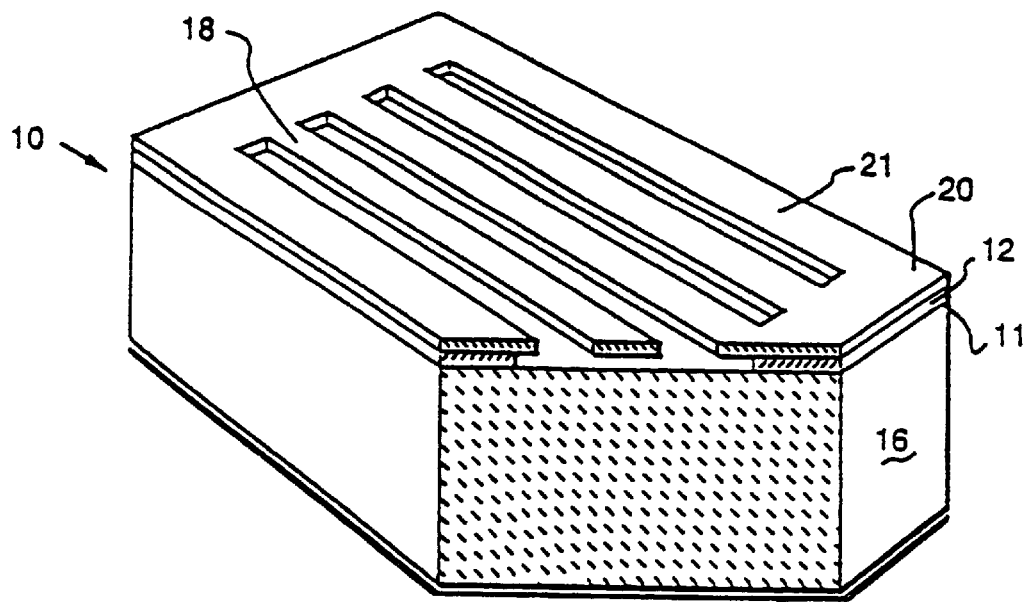

The grating light valve (GLV) or modulator is generally indicated at 10 in FIG. 1. The modulator 10 includes a number of elongated beam-like elements 18 which define a grating that, as will be later explained, can be used to spatially modulate an incident light beam. The elements 18 are formed integrally with an encompassing frame 21 which provides a relatively rigid supporting structure and maintains the tensile stress within the elongated elements 18. This structure defines a grating 20 which is supported by a partially etched silicon dioxide film 12 at a predetermined distance of 213 nm above the surface of a silicon substrate 16.

Before commencing the description of how the modulator 10 is fabricated, it should be noted that, in this case, each of the elements 18 are 213 nm thick and are suspended a distance of 213 nm clear of the substrate 16. This means that the distance from the top of each element to the top of the substrate is 426 nm. This distance is known as the grating amplitude.

One method of fabricating the modulator 10 is illustrated in FIGS. 2(a)–(d).

Figure 2A:
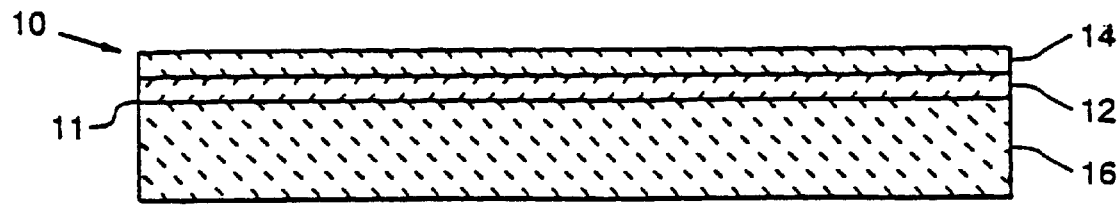

The first step, as illustrated in FIG. 2(a), is the deposition of an insulating layer 11 made of stoichiometric silicon nitride topped with a buffer layer of silicon dioxide. This is followed by the deposition of a sacrificial silicon dioxide film 12 and a low-stress silicon nitride film 14, both 213 nm thick, on a silicon substrate 16. The low-stress silicon nitride film 14 is achieved by incorporating extra silicon (beyond the stoichiometric balance) into the film, during the deposition process. This reduces the tensile stress in the silicon nitride film to roughly 200 MPa.

Figure 2B:
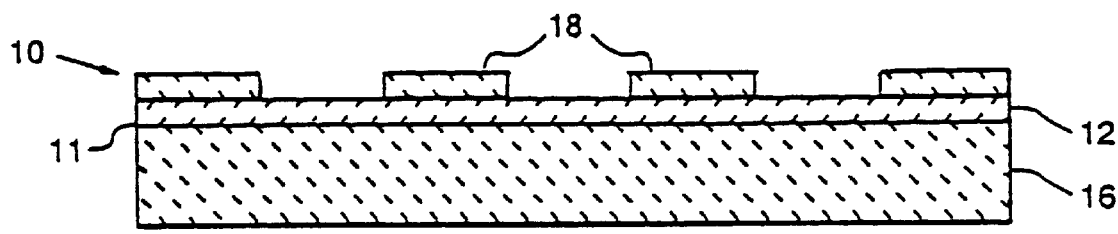

In the second step, which is illustrated in FIG. 2(b), the silicon nitride film 14 is lithographically patterned and dry-etched into a grid of grating elements in the form of elongated beam-like elements 18. After this lithographic patterning and etching process a peripheral silicon nitride frame 21 remains around the entire perimeter of the upper surface of the silicon substrate 16. In an individual modulator, all of the elements are of the same dimension and are arranged parallel to one another with the spacing between adjacent elements equal to the width thereof. Depending on the design of the modulator, however, elements could typically be 1, 1.5 or 2 $\mu$m wide with a length that ranges from 10 $\mu$m to 120 $\mu$m.

Figure 2C:
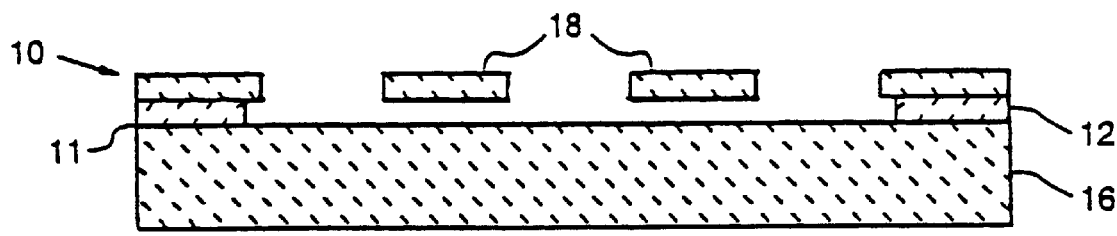

After the patterning process of the second step, the sacrificial silicon dioxide film 12 is etched in hydrofluoric acid, resulting in the configuration illustrated in FIG. 2(c). It can be seen that each element 18 now forms a free standing silicon nitride bridge, 213 nm thick, which is suspended a distance of 213 nm (this being the thickness of the etched away sacrificial film 12) clear of the silicon substrate. As can further be seen from this figure, the silicon dioxide film 12 is not entirely etched away below the frame 21, and so the frame is supported, at a distance of 213 nm, above the silicon substrate 16 by this remaining portion of the silicon dioxide film 12. The elements 18 are stretched within the frame and kept straight by the tensile stress imparted to the silicon nitride film 14 during the deposition of that film.

Figure 2D:
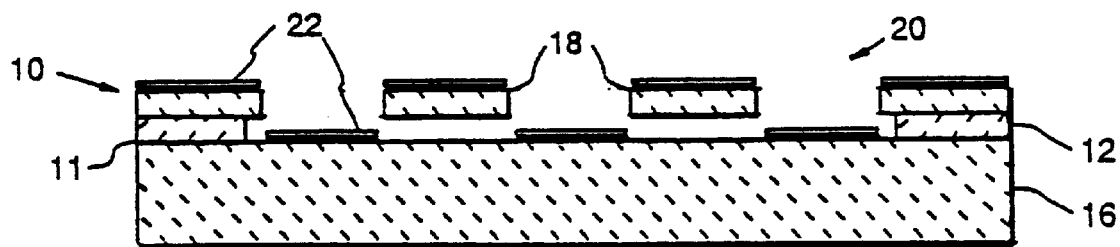

The last fabrication step, illustrated in FIG. 2(d), is sputtering, through a stencil mask, of a 50 nm thick aluminum film 22 to enhance the reflectance of both the elements 18 and the substrate 16 and to provide a first electrode for applying a voltage between the elements and the substrate. A second electrode is formed by sputtering an aluminum film 24, of similar thickness, onto the base of the silicon substrate 16.

It should be realized that the above described manufacturing process illustrates only one type of modulator and only one fabrication process. A more detailed description of other fabrication possibilities will be given below with reference to FIGS. 12 to 18.

Figure 3:
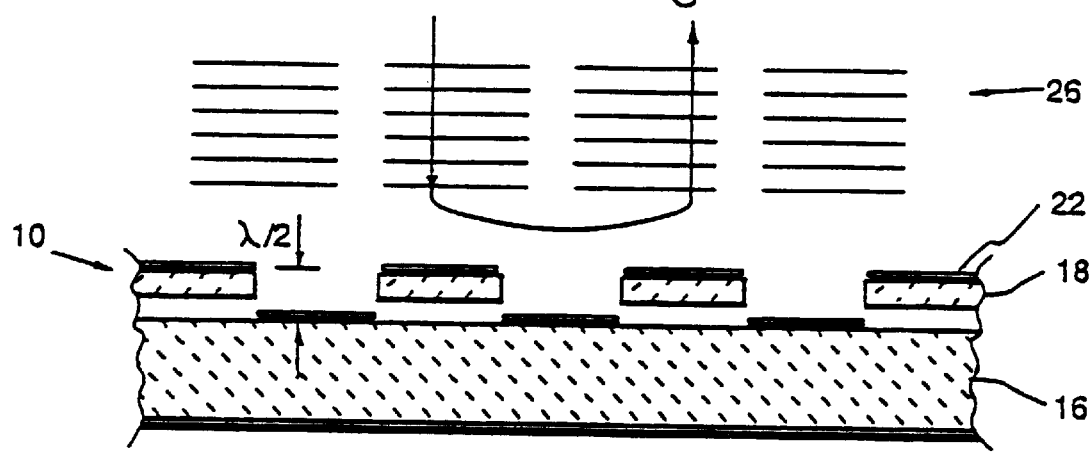
FIG. 3 illustrates the operation of the modulator of FIG. 1 in its "non-diffracting" mode.
Figure 4:
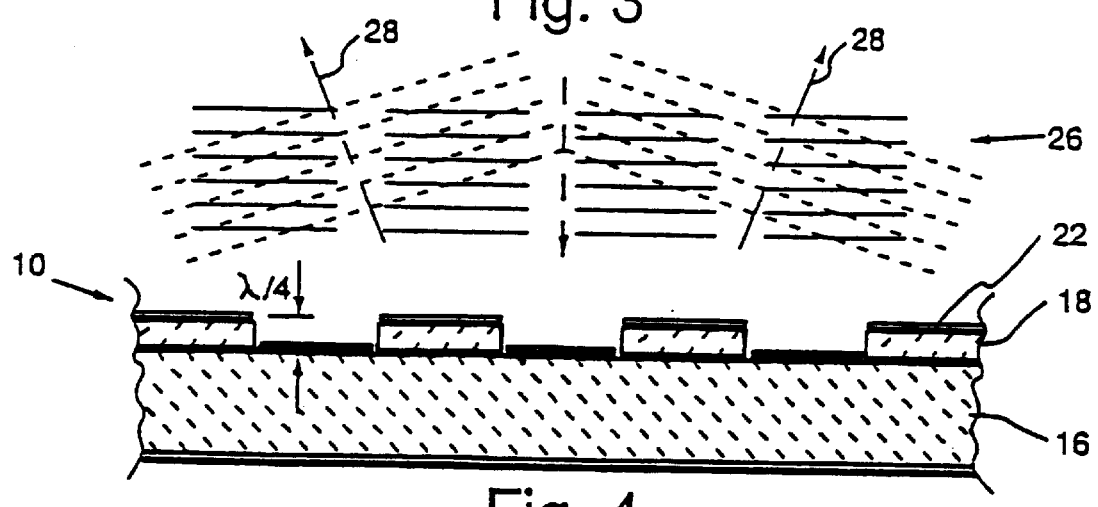
FIG. 4 illustrates the operation of the modulator of FIG. 3 in its "diffracting" mode.

The operation of the modulator 10 is illustrated with respect to FIGS. 3 and 4.

In FIG. 3 the modulator 10 is shown with no voltage applied between the substrate 16 and the individual elements 18 and with a lightwave, generally indicated at 26, of a wavelength $\lambda$=852 nm is incident upon it. The grating amplitude of 426 nm is therefore equal to half of the wavelength of the incident light with the result that the total path length difference for the light reflected from the elements and from the substrate equals the wavelength of the incident light. Consequently, light reflected from the elements and from the substrate add in phase and the modulator 10 acts to reflect the light as a flat mirror.

However, as illustrated in FIG. 4, when a voltage is applied between the elements 18 and the substrate 16 the electrostatic forces pull the elements 18 down onto the substrate 16, with the result that the distance between the top of the elements and the top of the substrate is now 213 nm. As this is one quarter of the wavelength of the incident lights, the total path length difference for the light reflected from the elements and from the substrate is now one half of the wavelength (426 nm) of the incident light and the reflections interfere destructively, causing the light to be diffracted, as indicated at 28.

Thus, if this modulator is used in combination with a system, for detecting the diffracted light, which has a numerical aperture sized to detect one order of diffracted light from the grating e.g., the zero order, it can be used to modulate the reflected light with high contrast.

The electrical, optical and mechanical characteristics of a number of modulators, similar in design to the modulator illustrated above but of different dimensions were investigated by using a Helium Neon laser (of 633 nm wavelength) focused to a spot size of 36 $\mu$m on the center portion of each modulator. This spot size is small enough so that the curvature of the elements in the region where the modulator was illuminated can be neglected, but is large enough to allow the optical wave to be regarded as a plane wave and covering enough grating periods to give good separation between the zero and first order diffraction modes resulting from the operation of the modulator. It was discovered that grating periods (i.e., the distance between the centerlines of two adjacent elements in the grating) of 2,3 and 4 $\mu$m and a wavelength of 633 nm resulted in first order diffraction angles of 18°, 14° and 9° respectively.

Figure 5:
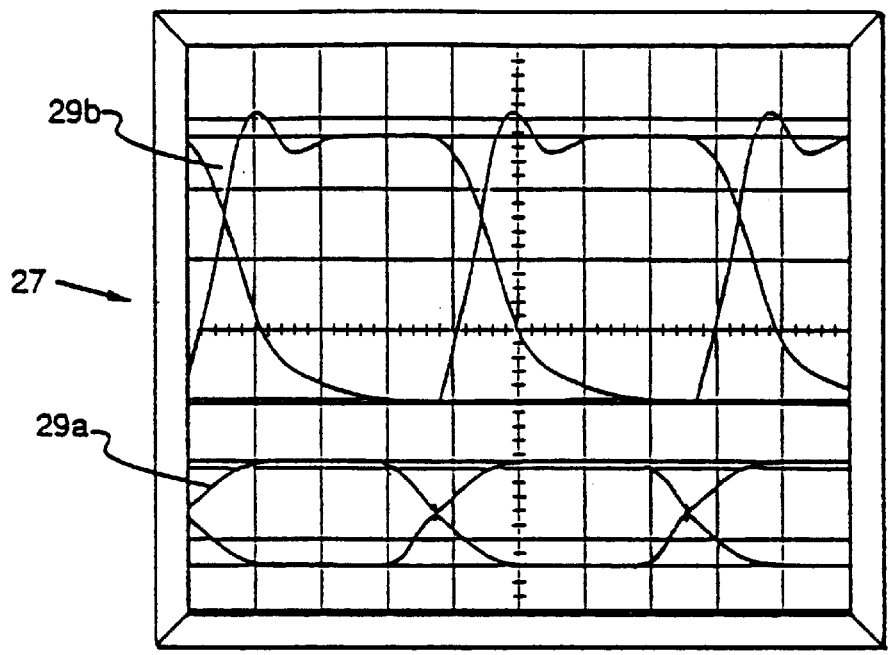
FIG. 5 is a graphical representation of the modulation of a laser beam by the modulator of FIG. 1.

One of these first order diffracted light beams was produced by using a grating modulator with 120 $\mu$m-long and 1.5 $\mu$m-wide elements at atmospheric pressure together with a HeNe light beam modulated at a bit rate of 500 kHz detected by a low-noise photoreceiver and viewed on an oscilloscope. The resulting display screen 27 of the oscilloscope is illustrated in FIG. 5.

However, before proceeding with a discussion of the features illustrated in this figure, the resonant frequency of the grating elements should first be considered.

The resonant frequency of the mechanical structure of the diffraction grating of the modulator was measured by driving the modulator with a step function and observing the ringing frequency. The area of the aluminum on the modulator is roughly 0.2 cm$^2$, which corresponds to an RC limited 3-dB bandwidth of 1 MHz with roughly 100 ohms of series resistance. This large RC time constant slowed down the step function, however, enough power existed at the resonant frequency to excite vibrations, even in the shorter elements. Although the ringing could be observed in normal atmosphere, the Q-factor was too low (approximately 1.5) for accurate measurements, so the measurements were made at a pressure of 150 mbar. At this pressure, the Q-factor rose to 8.6, demonstrating that air resistance is the major damping mechanism, for a grating of this nature, in a normal atmosphere.

Nonetheless, it was found that due to the high tensile stress in the beam-like elements, tension is the dominant restoring force, and the elements could therefore be modeled as vibrating strings. When this was done and the measured and theoretically predicted resonance frequencies were compared, it was found that the theory was in good agreement with the experimental values, particularly when considering the uncertainty in tensile stress and density of the elements. As it is known that the bandwidth of forced vibrations of a mechanical structure is simply related to the resonance frequency and Q-factor, a Q-factor of 1.5 yields a 1.5 dB bandwidth of the deformable grating modulator 1.4 times larger than the resonance frequency. The range of bandwidths for these gratings is therefore from 1.8 MHz for the deformable grating modulator with 120 $\mu$m long elements to 6.1 MHz for the deformable grating modulator with 40 $\mu$m long elements.

Returning now to FIG. 5, it should be noted that with an applied voltage swing of 3 V, a contrast of 16 dB for the 120 $\mu$m-long bridges could be observed. Here the term "modulation depth" is taken to mean the ratio of the change in optical intensity to peak intensity.

The input (lower trace 29a) on the screen 27 represents a pseudo-random bit stream switching between 0 and −2.7 V across a set of grating devices on a 1 cm by 1 cm die. The observed switching transient with an initial fast part followed by a RC dominated part, is caused by the series resistance of the deformable grating modulator, which is comparable to a 50 ohm source resistance.

The output (upper trace 29b) on the screen corresponds to the optical output of a low-noise photoreceiver detecting the first diffraction order of the grating used. The output (upper trace 29b) from the photoreceiver is inverted relative to the light detected from the deformable grating and is high when the elements are relaxed and low when the elements are deflected. Ringing is observed only after the rising transient, because of the quadratic dependence of the electro-static force on the voltage (during switching from a voltage of −2.7 V to 0 V, the initial, faster part of the charging of the capacitor corresponds to a larger change in electro-static force, than when switching the opposite way). This ringing in the received signal indicates a decay close to critical damping.

Furthermore, it was found that because the capacitance increases as the beam-like elements are pulled toward the substrate, the voltage needed for a certain deflection is not a linearly increasing function of this deflection. At a certain applied voltage condition, an incremental increase in the applied voltage causes the elements to be pulled spontaneously to the substrate (to latch) and this voltage is known as the "switching voltage" of the modulator. The switching voltage was found to be 3.2 V for gratings with 120 $\mu$m long elements and, if it is assumed that tension dominates the restoring forces, the switching voltage is inversely proportional to the element length and therefore, the predicted switching voltage for 40 $\mu$m long elements will be 9.6 V.

The importance of the switching voltage is that below this voltage, the deformable grating modulator can be operated in an analog fashion, however, if a voltage greater than the switching voltage is applied to the modulator it acts in a digital manner. Nonetheless, it is important to note that operating the modulator to the point of contact is desirable from an applications point of view, because as discussed above when the elements are deflected electrostatically, an instability exists once the element deflection goes beyond the one-third point. This results in hysteretic behavior which will "latch" the element in the down position. This latching feature gives the modulator the advantages of an active matrix design without the need for active components. A further advantage of this latching feature is that once the element has "latched" it requires only a very small "holding voltage", much smaller than the original applied voltage, to keep the element in its latched configuration. This feature is particularly valuable in low power applications where efficient use of available power is very important.

Figure 6:
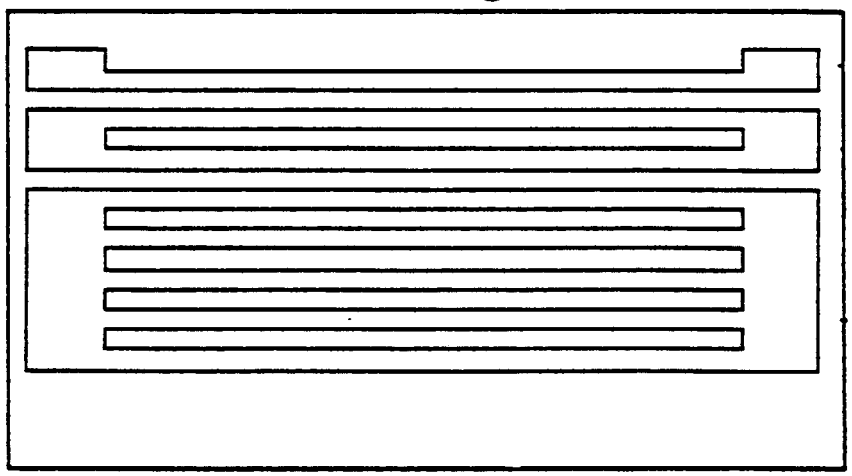
FIG. 6 is an illustration of one way in which one modulator can be combined with other modulators to form a complex modulator.

The use of the modulator of this invention in displays requires high yield integration of individual modulator units into 2-D arrays such as that illustrated in FIG. 6. This figure shows a plurality of contiguous grating modulator units which can be used to provide a gray-scale operation. Each of the individual modulators consists of a different number of elements, and gray-scale can be obtained by addressing each modulator in a binary-weighted manner. The hysteresis characteristic for latching (as described above) can be used to provide gray-scale variation without analog control of the voltage supplied to individual grating modulator elements.

Figure 7:
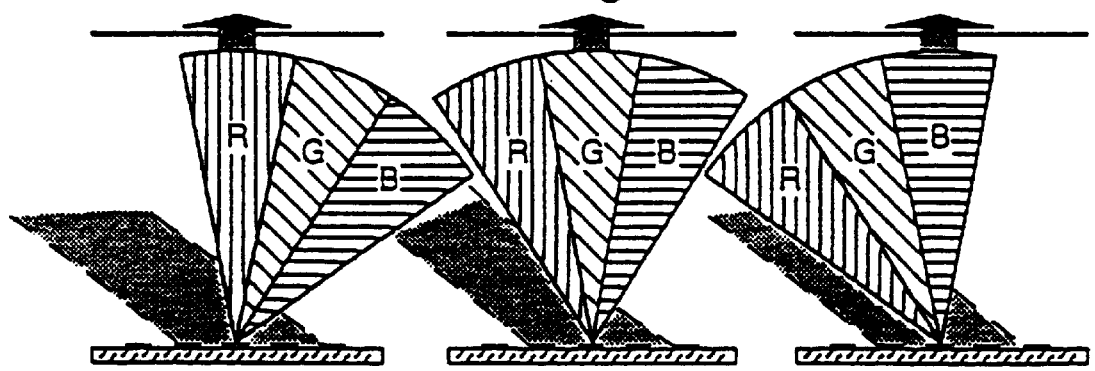
FIG. 7 illustrates the operation of the modulator in the modulation of white light to produce colored light.

In FIG. 7 the use of the GLV, in combination with other gratings (GLVs), for modulating white light to produce colored light is illustrated. This approach takes advantage of the ability of a GLV to separate or disperse a light spectrum into its constituent colors. By constructing an array of pixel units, each including separate but contiguous red, green and blue modulation units of GLVs, each with a grating period designed to diffract the appropriate color into a single optical system, a color display that is illuminated by white light can be achieved. This approach may be attractive for large area projection displays.

Alternative Embodiments

Figure 8:
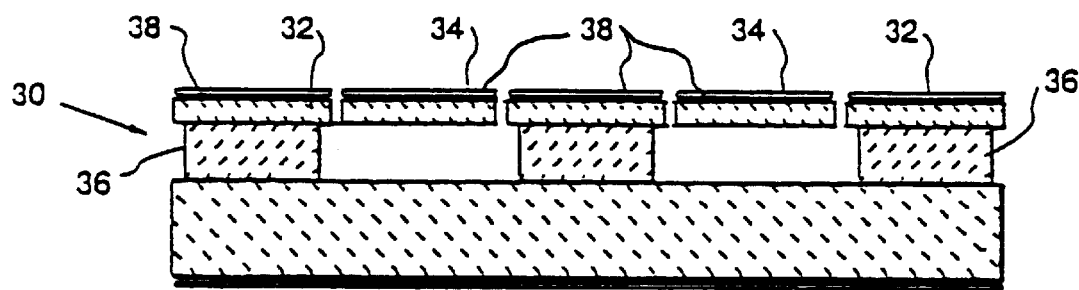
FIG. 8 is a cross-section similar to that in FIG. 3, illustrating an alternative embodiment of the modulator in its "non-diffracting" mode.
Figure 9:
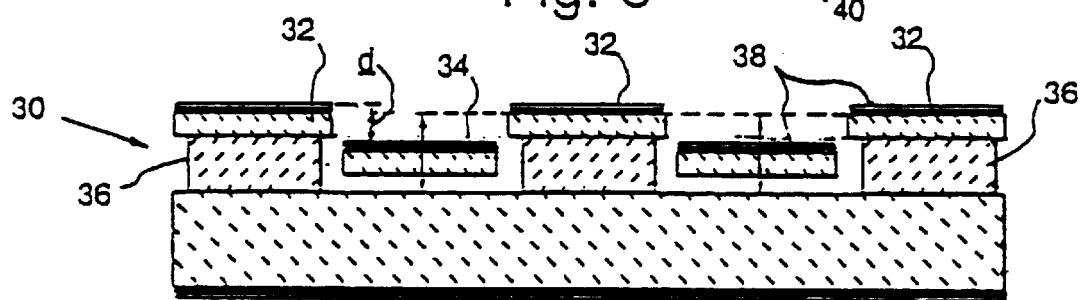
FIG. 9 is a cross-section similar to that in FIG. 4, illustrating the modulator of FIG. 8 in its "diffracting" mode.

In FIGS. 8 and 9 an alternative embodiment of the diffraction modulator 30 of the invention is illustrated. In this embodiment the modulator 30 consists of a plurality of equally spaced, equally sized, fixed elements 32 and a plurality of equally spaced, equally sized, movable beam-like elements 34 in which the movable elements 34 lie in the spaces between the fixed elements 32. Each fixed element 32 is supported on and held in position by a body of supporting material 36 which runs the entire length of the fixed element 32. The bodies of material 36 are formed during a lithographic etching process in which the material between the bodies 36 is removed.

As can be seen from FIG. 8 the fixed elements 32 are arranged to be coplanar with the movable elements 34 and present a flat upper surface which is coated with a reflective layer 38. As such the modulator 30 acts as a flat mirror when it reflects incident light, however, when a voltage is applied between the elements and an electrode 40 at the base of the modulator 30 the movable elements 34 move downwards as is illustrated in FIG. 9. By applying different voltages the resultant forces on the elements 34 and, therefore, the amount of deflection of the movable elements 34 can be varied. Accordingly, when the grating amplitude (defined as the perpendicular distance d between the reflective layers 38 on adjacent elements) is m/4 times the wavelength of the light incident on the grating 30, the modulator 30 will act as a plane mirror when m=0, 2, 4 . . . (i.e., an even number or zero) and as a reflecting diffraction grating when m=1, 3, 5 . . . (i.e., an odd number). In this manner the modulator 30 can operate to modulate incident light in the same manner as the modulator illustrated as the first embodiment.

Figure 10:
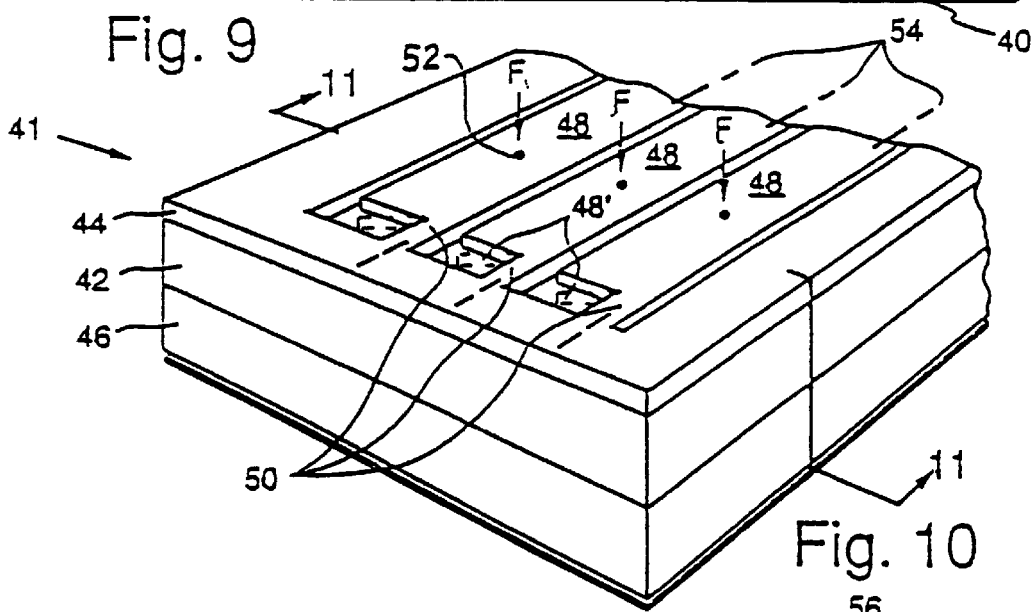
FIG. 10 is a pictorial view illustrating a further embodiment of a modulator.
Figure 11:
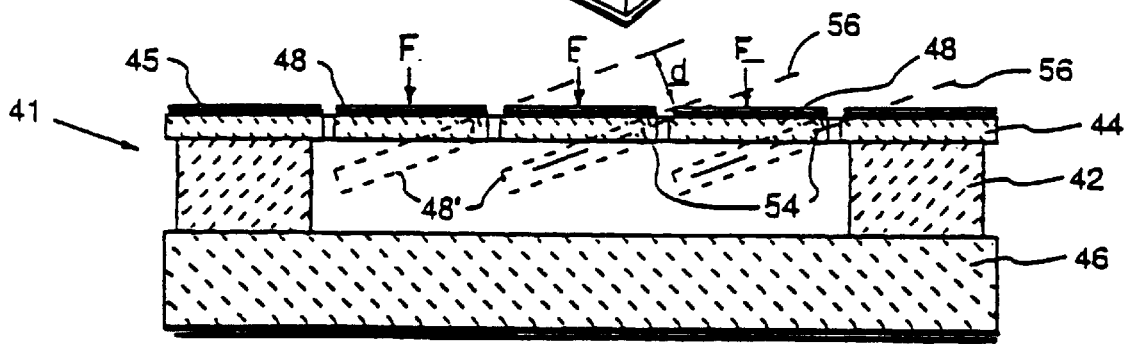
FIG. 11 is a cross-section taken along line 11—11 in FIG. 10.

Yet another embodiment of the modulator of the invention is illustrated in FIGS. 10 and 11. As with the other embodiments, this modulator 41 consists of a sacrificial silicon dioxide film 42, a silicon nitride film 44 and a substrate 46. In this embodiment, however, the substrate 46 has no reflective layer formed thereon and only the silicon nitride film 44 has a reflective coating 45 formed thereon. As is illustrated in FIG. 10 the deformable elements 48 are coplanar in their undeformed state and lie close to one another so that together they provide a substantially flat reflective surface. The elements 48 are, however, formed with a neck 50 at either end, which is off-center of the longitudinal center line of each of the elements 48.

When a uniformly distributed force, as a result of an applied voltage for example, is applied to the elements 48 the resultant force F, for each element 48, will act at the geometric center 52 of that element. Each resultant force F is off-set from the axis of rotation 54 (which coincides with the centerline of each neck 50), resulting in a moment of rotation or torque being applied to each element 48. This causes a rotation of each element 48 about its axis 54 to the position 48' indicated in broken lines. This is known as "blazing" a diffraction grating.

As can be seen from FIG. 11, the reflective planes 56 of the elements 48 remain parallel to each other even in this "blazed" configuration and therefore, the grating amplitude d is the perpendicular distance between the reflective surfaces of adjacent elements. This "blazed grating" will operate to diffract light in the same manner as a sawtooth grating.

The basic fabrication procedure of yet another embodiment of the modulator 68 is illustrated in FIGS. 12(a)–(c). First, 132 nm of silicon dioxide layer 70 followed by 132 nm of silicon nitride layer 72 are deposited on a boron-doped wafer 74 using low pressure chemical vapor deposition techniques. The tensile stress in the silicon nitride layer 72 ranges from 40 to 800 MPa, depending on the ratio of the dichlorosilane and ammonia gases present during the deposition process. Tensile stress effects the performance of the modulator of the invention as higher tensile stress results in stiffer elements and, therefore, faster switching speeds but also requires higher voltages to operate the modulator.

Thereafter a photoresist (not shown) is layered onto the silicon nitride layer 72 and patterned after which the silicon nitride layer 72 is dry-etched down to the silicon dioxide layer 70 (FIG. 12(a)). The oxide layer 70 is also partially dry-etched as shown in FIG. 12(b). Then the photoresist is stripped.

Photoresist removal is followed by a buffered oxide etch which isotropically undercuts the silicon dioxide 70 from beneath the silicon nitride. Since the nitride frame (not shown) is wider than the remaining nitride elements 76, some oxide is left beneath it to act as an oxide spacer. Processing is completed when 30 nm layer of aluminum is evaporated onto the elements 76 and the substrate 74 to form the top and bottom electrodes and to enhance the reflectivity.

Typically the elongated elements formed by this process would be either 1.0, 1.25 or 1.50 µm wide, which respectively can be used for blue, green and red light modulators.

It is possible that, when the released element structures are dried, the surface tension forces of the solvents could bring the elements down and cause them to stick. In addition, when the modulators are operated the elements could come down into intimate contact with the substrate and stick.

Various methods could be used to prevent the sticking of the nitride elements to the substance: freeze-drying, dry etching of a photoresist-acetone sacrificial layer, and OTS monolayer treatments. These techniques seek to limit stiction by reducing the strength of the sticking-specific-force (that is, force per unit of contact area). Furthermore, the use of stiffer elements by using shorter elements and tenser nitride films, is possible.

Since the force causing the elements to stick to the underlying material is the product of the contact area between the two surfaces and the specific force, however, other methods to reduce sticking could include:

(a) reducing the area of contact by roughening or corrugating; and
(b) reducing the specific force by changing the chemical nature of the surfaces.

One method of reducing the contact area could be by providing a composite element in which the top of the element is aluminum to enhance reflectivity, the second layer is stressed nitride to provide a restoring force, and the third layer is course-grained polysilicon to reduce effective contact area.

Still other methods of reducing the contact area between the bottoms of the elements and the substrate exist and are described below with reference to FIGS. 13(a)–15(c).

As is illustrated in FIGS. 13(a) and (b), contact area can be reduced by patterning lines 79 on the substrate or on the bottoms of the elements. These lines 79 are typically 1 µm wide, 200 Å high and spaced at 5 µm centers. As shown, the lines are arranged perpendicular to the direction of the elements and located on the substrate. Alternatively the lines could be parallel to the direction of the elements.

The procedure is to first pattern and dry etch a blank silicon wafer. Then a low temperature oxide layer 80 or other planar film is deposited followed by processing as above to yield the configuration in FIG. 13(*b*).

A different way of obtaining the same result is illustrated in FIGS. 14(*a*) and (*b*), in which oxide is grown on a bare silicon substrate 94, and patterned and dry or wet etched to form grooves 89, 1 μm wide on 5 μm centers, 200 Å deep after which processing continues as described above. This yields the final structure shown in FIG. 14(*b*).

Figure 15A:
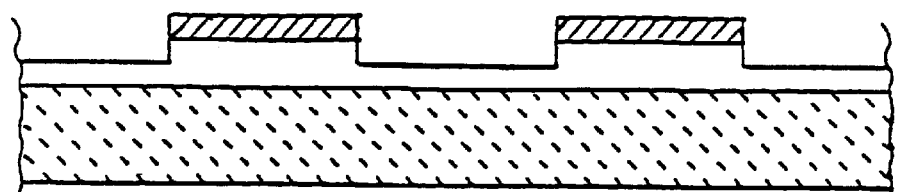
Figure 15B:
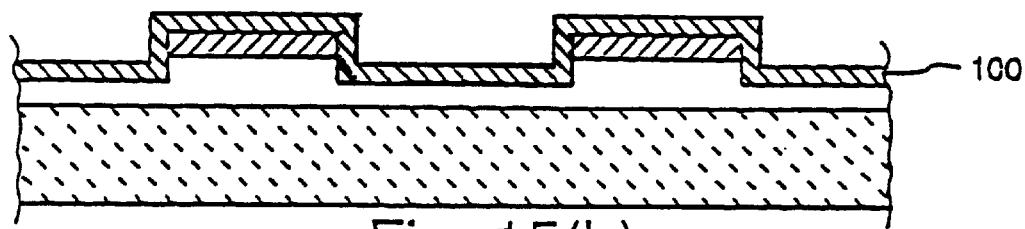
Figure 15C:
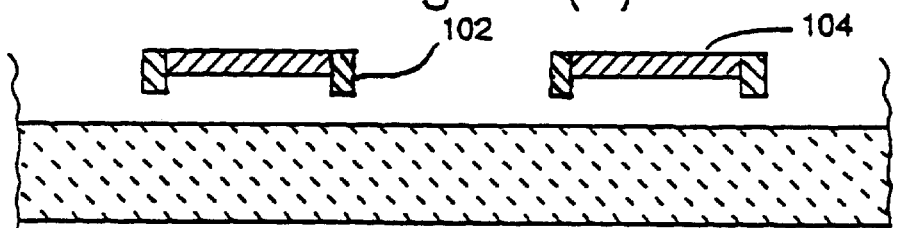
Figure 16A:
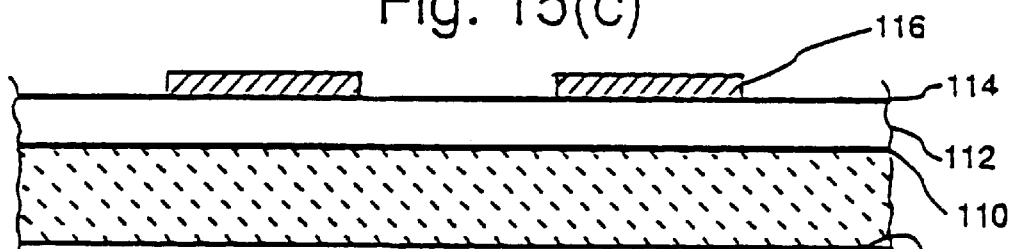
Figure 16B:
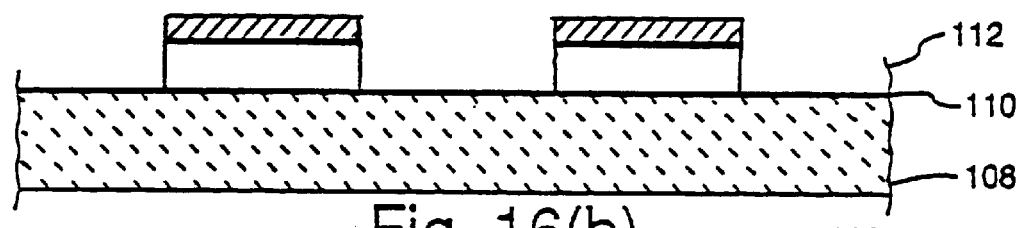
Figure 16C:
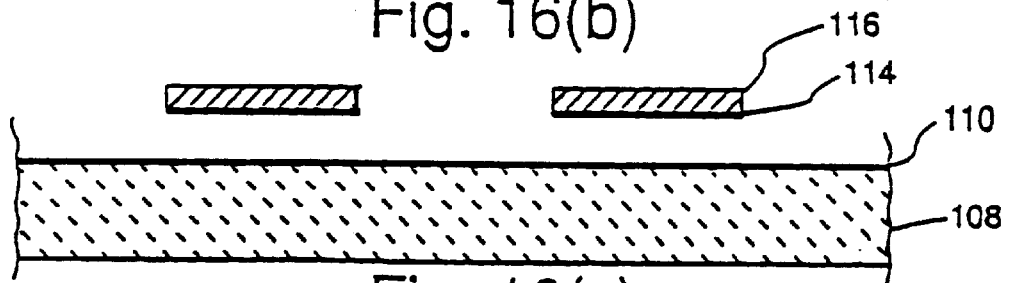
Figure 17A:
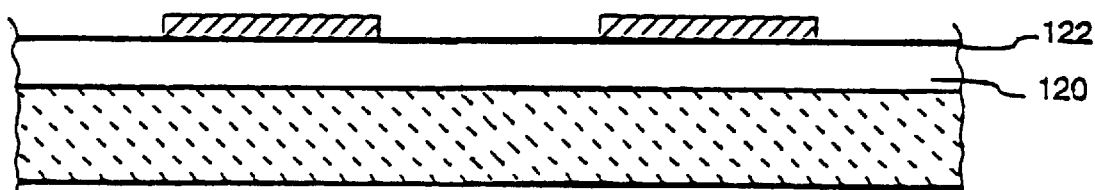
Figure 17B:
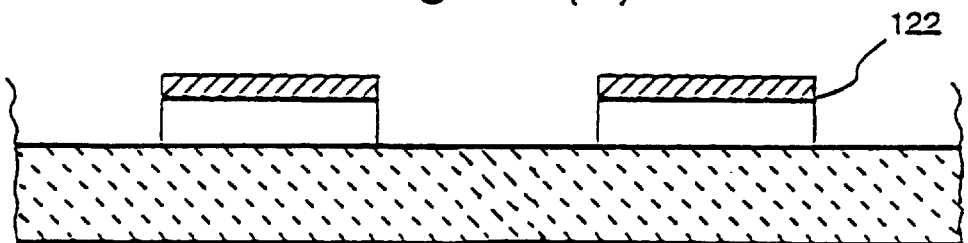
Figure 17C:
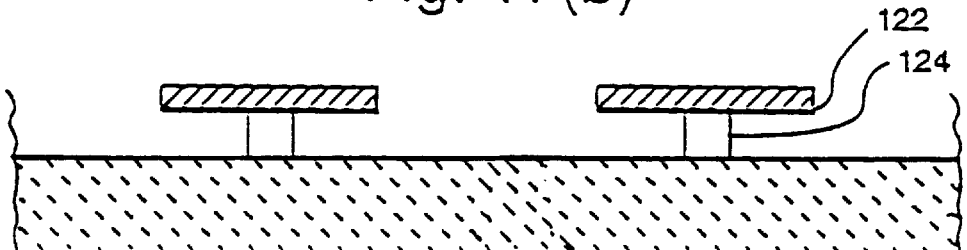
Figure 17D:
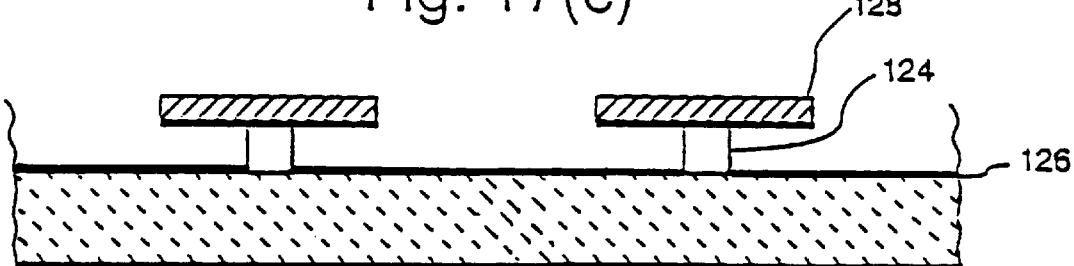
Figure 17E:
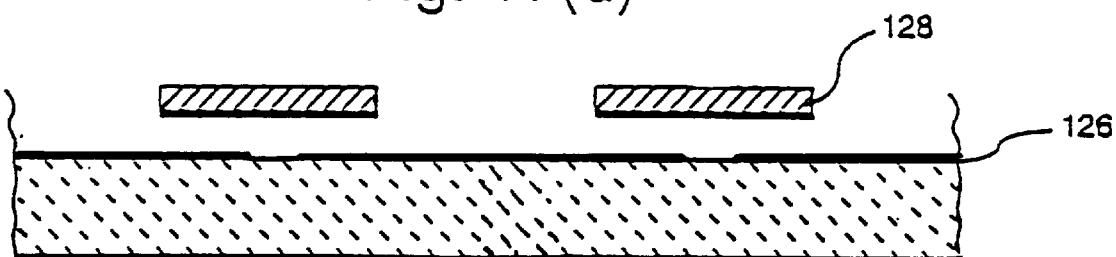

Yet another method of reducing the geometric area of contacting surfaces is illustrated in FIGS. 15(*a*)–(*c*).

After photoresist removal (FIG. 15(*a*)), a second layer 100 of about 50 nm nitride is deposited. As shown in FIG. 15(*b*), this second layer also coats the side-walls, such that a following anisotropic plasma etch which removes all of the second layer nitride 100 in the vertically exposed areas, leaves at least one side-wall 102 that extends below the bottom of each nitride element 104. It is at this point that the buffered oxide etch can be done to release the elements to yield the structure of FIG. 15(*c*). With the side-wall spacer acting as inverted rails for lateral support, contact surfaces are minimized preventing sticking. In operation, it is believed that the elements, when deformed downwards, will only contact the substrate at the areas of the downwardly protruding rails.

As the adhesion forces are proportional to the area in contact, they are substantially reduced by this configuration resulting in operational gratings with elements having a tensile stress on the order 200 MPa and being up to 30 μm long. The rail structures also operate to maintain optically flat surfaces and have the advantage of not requiring additional masking steps during their manufacture.

Sticking can also be addressed by changing the materials of the areas that will come into contact. It is thought that although the level of sticking between different materials will be similar, the surface roughness of films differs significantly, effectively changing the contact area.

One method of achieving this is that the element material can be changed to polycrystalline silicon. This material will have to be annealed to make it tensile. It can also use silicon dioxide as its sacrificial layer underneath.

Another method is to use a metallic element material (e.g. aluminum) and an organic polymer such as polyamide as the sacrificial layer.

Yet another method is to use polymorphic element material. This results in an initial multilayer structure which can be patterned, as described in FIGS. 16(*a*)–16(*c*) to form a element structure mostly made of silicon nitride but which has contact areas of other engineered materials.

This is done by:

(i) First depositing a substrate 108 covering layer 110 with low or high-stress silicon nitride or fine- or course-grained polymorphic element material. This layer should be approximately 100 Å and acts as a first (lower) contact surface.

(ii) Depositing a layer 112 of low temperature oxide at 400° C.

(iii) Depositing a second contacting surface layer 114. This layer should be thin (about 100 Å) so as not to change the mechanical properties of the silicon nitride element.

(iv) Finally, depositing the silicon nitride element material 116, after which dry-etching and undercutting similar to that described above is done.

One slight variation on the above process, which is illustrated in FIGS. 17(*a*)–(*e*), is to deposit on the substrate a layer 120 of silicon dioxide over which a layer 122 of tungsten can be selectively deposited (e.g. by depositing only over exposed silicon surfaces).Instead of fully releasing the elements, as before, the oxide layer 120 is only partially removed by timing the etch to leave a thin column 124 of material supporting the structures from underneath (see FIG. 17(*c*)). Thereafter the wafers are placed back into a selective tungsten deposition chamber to get a layer 126 of tungsten covering the exposed silicon areas but not on the oxide columns 124 nor on the silicon nitride elements 128.

After depositing a thin layer 126 of tungsten as a new contact area, the oxide etch can be continued to fully release the elements 128 which, when deflected will come down onto a tungsten base.

Individual diffraction grating modulators in all of the above embodiments are approximately 25 μm square. To produce a device capable of modulating colored light (which contains red, green, and blue modulator regions) would therefore require a device 25×75 μm². To reduce this to a square device, each of the individual modulators must be reduced to 25×8 μm² by shortening the elements. Reduction of size in the other dimension is not possible because of diffraction limitations.

Figure 18A:
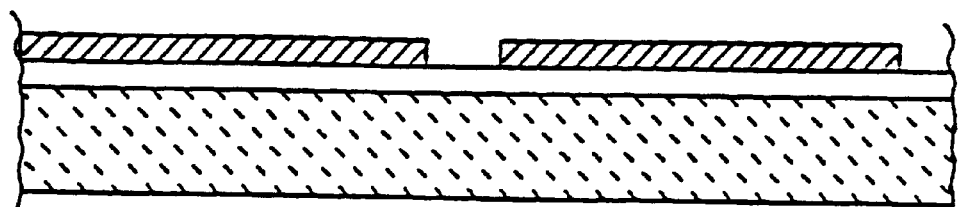
Figure 18B:
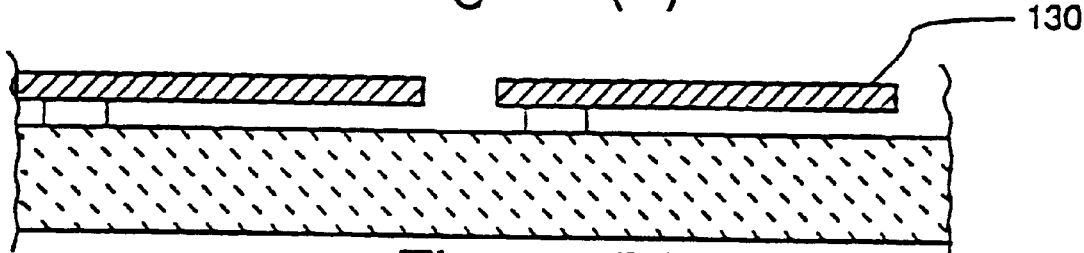

However, calculations reveal that 8 μm elements would, if constructed as described above, be too stiff to switch with practical voltages. A possible solution to this, as illustrated in FIGS. 18(*a*)–18(*b*), is the use of cantilever elements 130 rather than elements which are supported at either end. This is because elements that are supported at both ends are twice as stiff as cantilevers, which are supported at only one end.

Two-dimensional arrays of diffraction gratings may be constructed by defining two sets of conductive electrodes: the top, which are constructed as in the one-dimensional arrays out of metal or conductive silicon lithographically defined on the element, and the bottom. Two methods may be used to define the bottom electrodes.

Figure 19A:
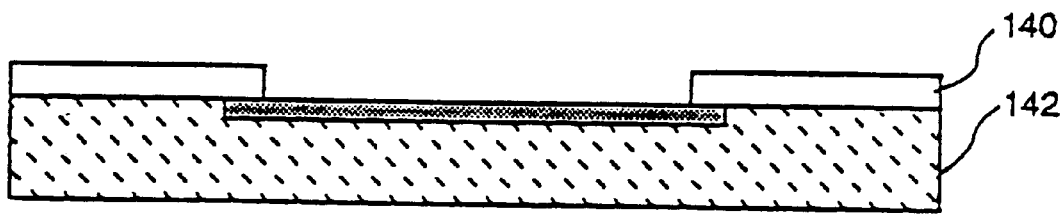
Figure 19B:
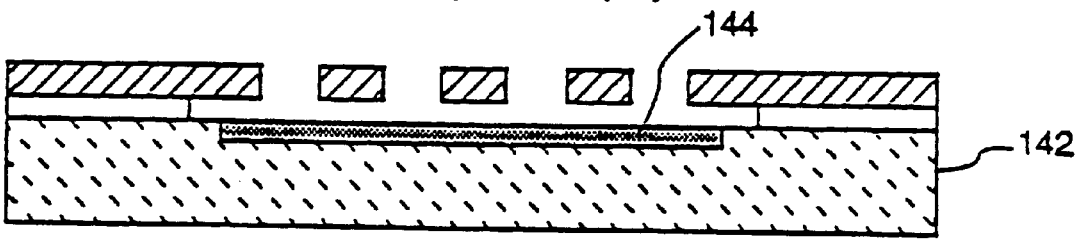

In the first method, illustrated in FIGS. 19(*a*) and (*b*), an oxide layer 140 is grown or deposited on a bare P- or N-type silicon wafer 142. The oxide is patterned and the wafer 142 subjected to a dopant diffusion of the opposite conductivity type, respectively N- or P-type, to produce a doped region 144. The beam-like elements are then fabricated on top of the diffused areas as previously described and aluminum is evaporated onto the surfaces as before. The diffused regions are held at ground and the PN junction formed with the substrate is reverse biased. This isolates the diffused regions from one another.

Figure 20:
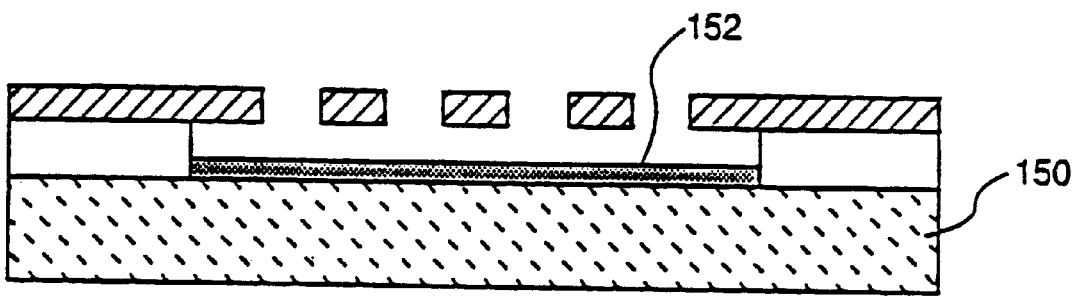

A second method shown in FIG. 20 is to use a nonconductive substrate 150 and pattern a refractory metal such as tungsten 152 over it. The wafer is then thermally oxidized and nitride or other element material is deposited over it. The elements are then patterned and released as above.

In summary, the reflective, deformable grating light modulator or GLV is a device which exhibits high resolution (25 by 8 μm² to 100 μm²); high response times/large bandwidth (2 to 10 MHz); high contrast ratio (close to 100% modulation with a 3V switching voltage); is polarization independent and easy to use. This device also has tolerance for high optical power, has good optical throughput, is simple to manufacture, semiconductor-processing compatible, and has application in a wide range of fields including use as an SLM and with fiber optic technology.

Figure 21:
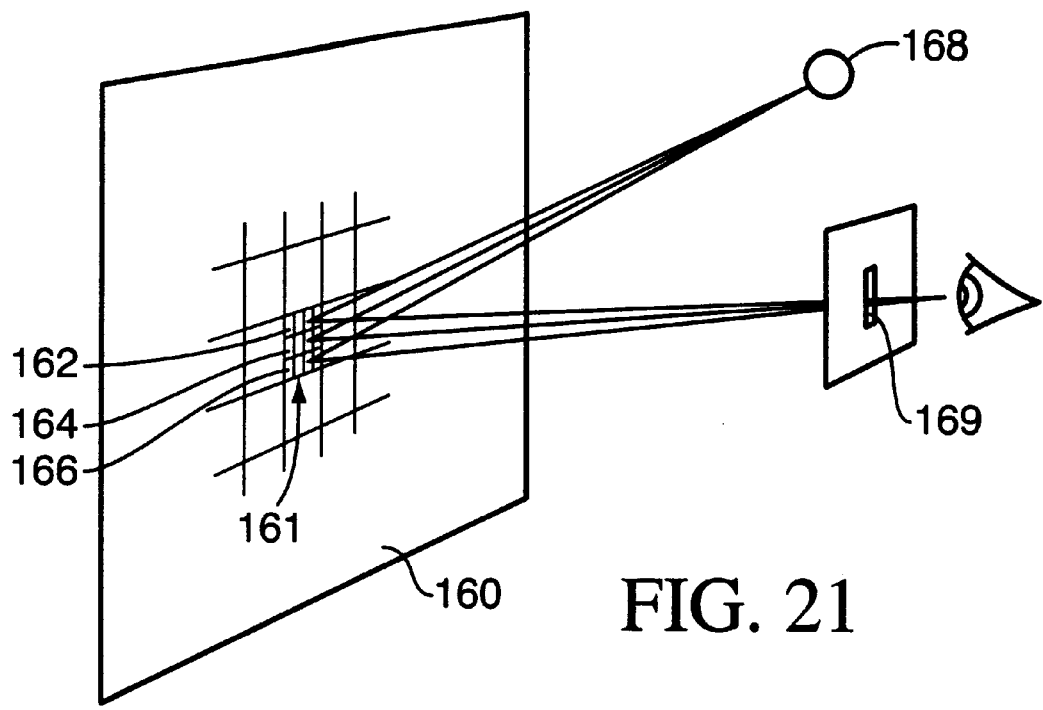
FIGS. 21, 22 and 28 are schematic diagrams illustrating embodiments of the present invention using either a white light source or colored light sources.

As generally described above, and as depicted in simplistic fashion in FIG. 21 of the drawing, a combination of GLVs can be used to provide a visual display by exploiting the grating dispersion of white light to isolate the three primary color components of each pixel in a color display system.

This type of schlieren optical system employs an array 160 of pixel units 161, each including three subpixel grating components (162, 164, 166) respectively having different grating periods selected to diffract red, green and blue spectral illumination from a white light source 168 through a slit 169 placed at a specific location relative to the source and the array. For each pixel unit in the array only a small but different part of the optical spectrum will be directed by each of the three subpixel components of each pixel unit through the slit 169 to the viewer. As a result, the three color constituents of each pixel unit will be integrated by the viewer's eye so that the viewer perceives a color image that spans the face of the entire array 160. In this implementation, all of the subpixel components have gratings with beam-like elements that are oriented in the same direction. The optical system can thus be analyzed in a single plane that passes through the source 168, the center of the pixel unit 161 under consideration, and the center of the viewer's pupil. Suitable lenses (riot shown) could also be used to ensure that the light diffracted and reflected from the array is focused onto the plane of the slit (aperture) and that the pixel plane is imaged onto the viewer's retina or onto a projection screen.

The array could be implemented to include fixed grating elements fabricated using photolithographic techniques to in effect "program" each pixel unit. Alternatively, the array 160 can be implemented as an active device in which appropriately routed address lines extend to each subpixel so that each such subpixel can be dynamically programmed by the application of suitable voltages to the subpixel components as described above.

It should also be noted that whereas three subpixel components are needed for generating a full-color pixel unit, only two subpixel components are needed to generate a multi-colored pixel, i.e., a pixel that can display a first color, a second color, a third color which is a combination of the first and second colors, or no color.

Figure 22:
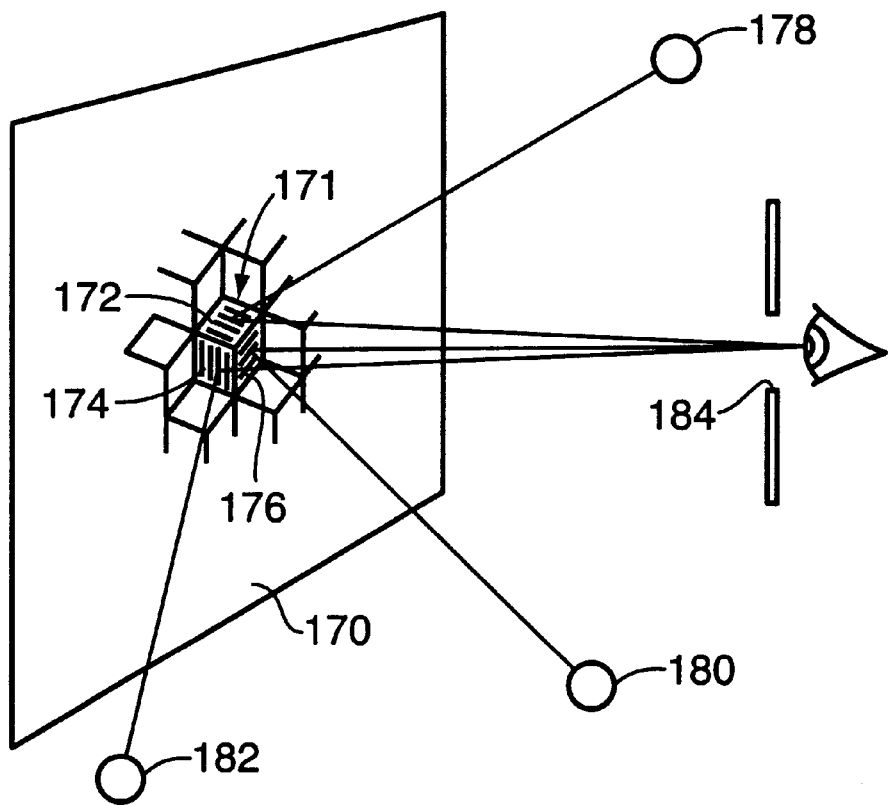

In an embodiment depicted in FIG. 22, instead of varying the periods of the gratings and using a white light source to generate color, each pixel unit is comprised of three subpixel grating components of substantially equal period but of different angular orientation, and each subpixel component is operatively combined with one of three primary color light sources. More particularly, the array 170 includes a plurality of pixel units 171, each of which is comprised of subpixel components 172, 174 and 176, oriented at 120° angles relative to each other. At least three monochromatic light sources are then positioned and trained on the array such that when a corresponding subpixel component of any pixel unit is in its diffraction mode, it will cause light from a particular source to be diffracted and directed through a viewing aperture. Red light from a red source 178 might for example be diffracted from subpixel component 172 and directed through aperture 184; blue light generated by a source 180 might be diffracted by a subpixel component 176 through aperture 184; and green light from a source 182 might be diffracted by a subpixel component 174 and directed through the opening 184 to the viewer's pupil. This system is an improvement over previously described implementations requiring a slit, because the viewing aperture 184 can be widened significantly, for example, at least 10X. Suitable lenses (not shown) could also be used in the embodiments of FIGS. 21 and 22 to ensure that the light diffracted and reflected from the array focuses onto the plane of the slit (aperture) and that the pixel plane is imaged onto the viewer's retina or onto a projection screen.

Figure 23:
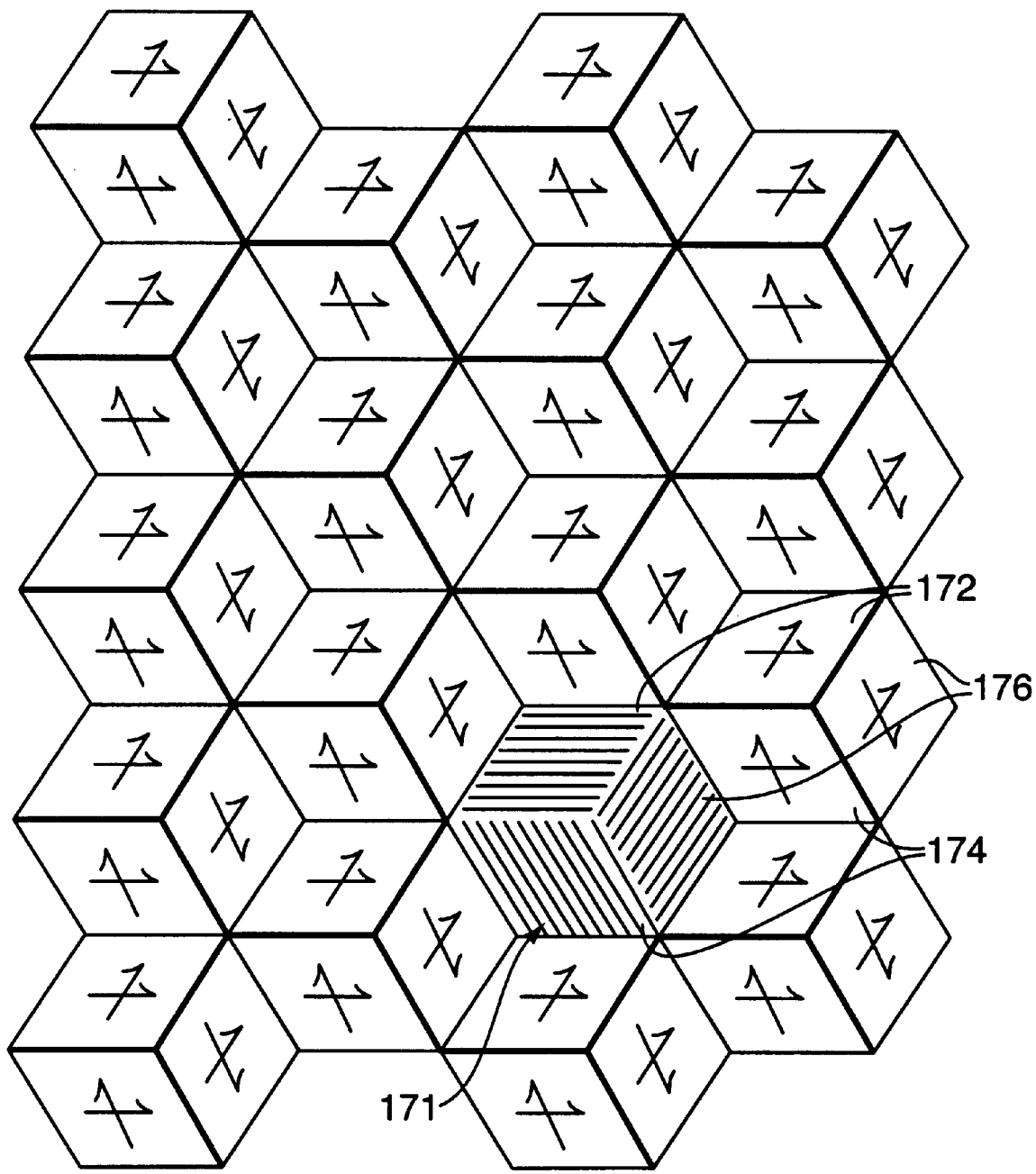
FIGS. 23–26 illustrate arrays of three color pixel units and show several alternative grating element configurations in accordance with the present invention.

The GLV layout of array 170 is more clearly depicted in FIG. 23 wherein sets of the three rhombus-configured subpixel components 172, 174 and 176 are collectively joined to form hexagonal pixel units 171 which can be tiled into a silicon chip array with a 100% filling factor. The grating elements of the three subpixel components 172, 174 and 176 are oriented 120 relative to each other as depicted and, except for the rhombus-shaped grating in the outer boundary, all have grating elements configured as described above.

Figure 24:
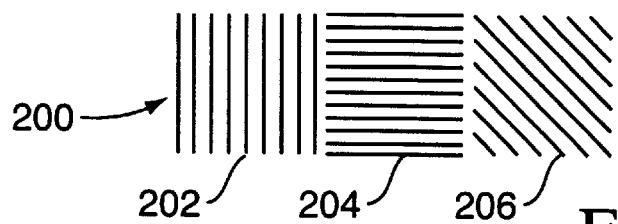
Figure 25:
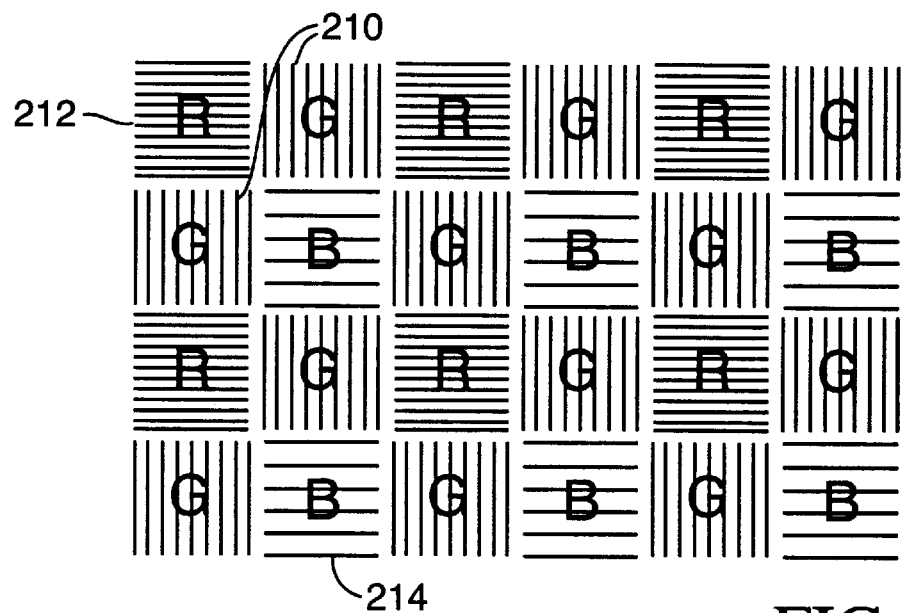
Figure 26:
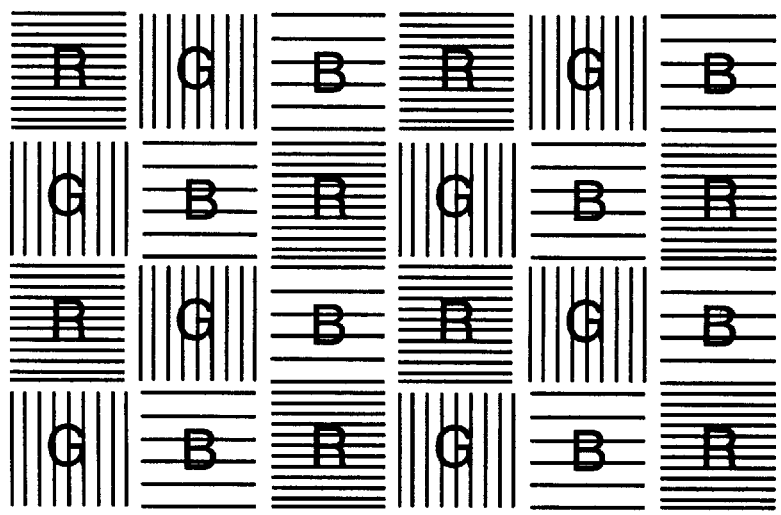

Other angular separations of subpixel gratings can also be chosen, as depicted in FIGS. 24, 25 and 26. In FIG. 24, an alternative three-component pixel unit 200 is illustrated, including three subpixel components 202, 204, and 206 aligned in a row and including grating elements which have relative angular separations of vertical, horizontal and 45°. While this configuration does not have the uniform grating element length advantage of the previous embodiment, it is based on the conventional rectangular coordinate system and is easier to manufacture than other embodiments. There are some possible GLV implementations, such as one in which an underlying mirror is the movable element rather than the grating elements, for which this design would be excellent.

A hybrid compromise scheme is to use angular orientation to distinguish between red-green and green-blue. Red and blue would still be distinguished by their different grating periods. In this scheme, the slit or aperture can be made significantly wider (by a factor of approximately 2). Exemplary layouts of such schemes are shown in FIGS. 25 and 26. In FIG. 25, note that there are twice as many green subpixel components (210) as red (212) and blue (214) subpixel components. This would actually be desirable in certain small direct-view devices, since LEDs would be used as the mono-chromatic illumination sources. Presently, red and blue LEDs are much brighter than green LEDs, thus one would want to design the display with more green area to compensate and have the colors balance.

The layout depicted in FIG. 26 has equal numbers of red, green and blue subpixels. Three subpixel components can be combined into one L-shaped, full color pixel unit. An advantage of both of these systems is that they use right-angle geometry, thereby simplifying design.

Figure 27:
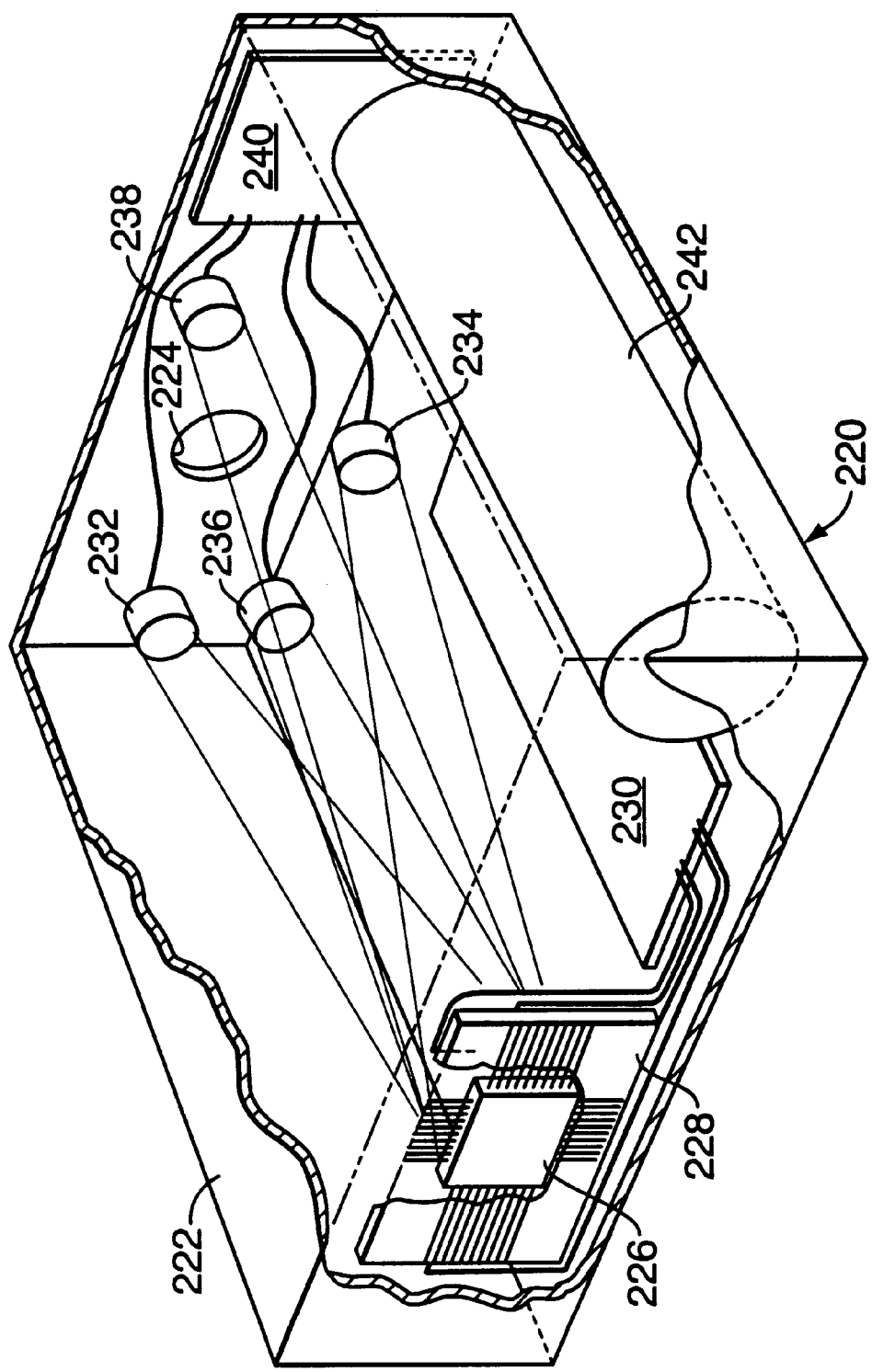
FIG. 27 is a partially broken perspective view of a pager-style communication device in accordance with the present invention.

Referring now to FIG. 27, an actual implementation of a small communication apparatus embodying the present invention is depicted at 220. The device includes a housing 222 about the size of that of a standard telephone pager. As illustrated, the housing 222 is partially broken away to reveal a viewing aperture 224 and the various internal components comprising a GLV chip 226, including an array of pixel units having subpixel grating components as described above, a suitable support and lead frame structure 228 for supporting the chip 226 and providing addressable electrical connection to each grating thereof, an electronic module 230 for receiving communicated data and generating drive signals for input to the chip 226, a red LED 232, a blue LED 234, and a pair of green LEDs 236 and 238, an LED-powering module 240, and a power supply battery 242. As suggested above with regard to FIGS. 21 and 22, appropriate lenses (not shown) may also be included.

The relative positioning of the LEDs 232–238 is of course determined by the grating configuration as suggested above. Two green LEDs are used in this embodiment to ensure that the green light output is roughly equivalent to the output intensity of the red and blue light sources. In the preferred embodiment, a typical distance between the chip 226 and the aperture 224 might be on the order of 2–10 cm, the aperture 224 might have a diameter in the range of 3 mm–1.5 cm, and suitable lens structures may be used in association with the LEDs, the chip face and/or the aperture.

Figure 28:
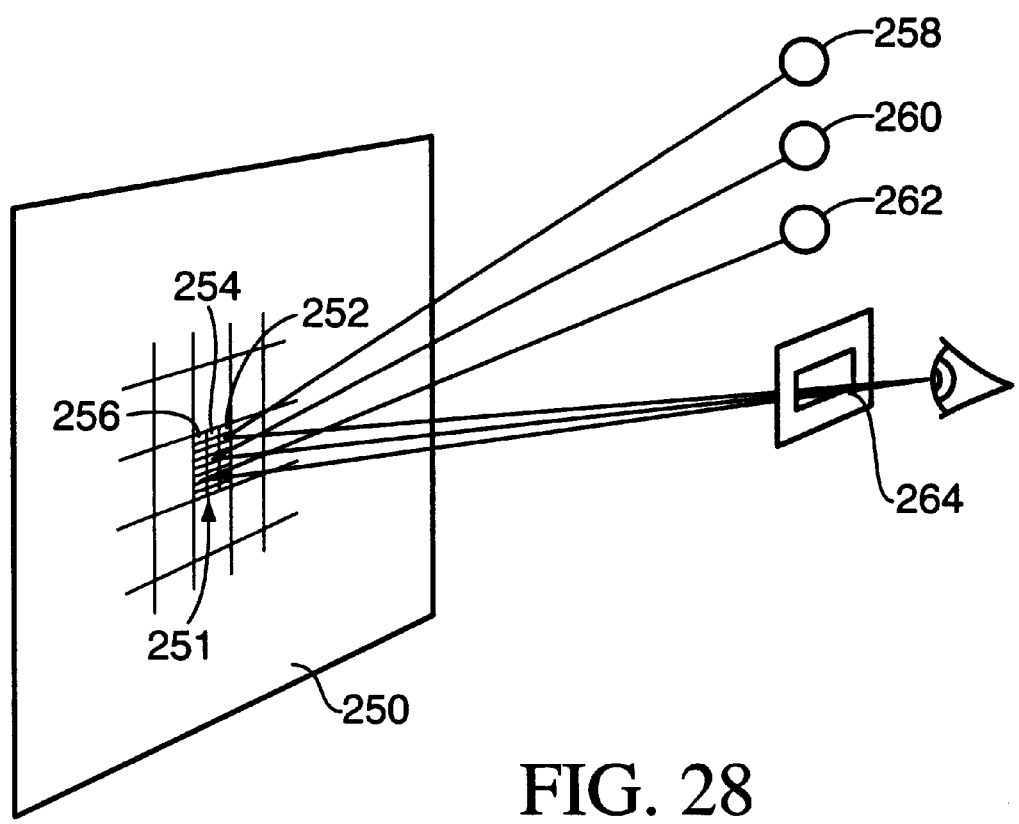

In the embodiment depicted in FIG. 28, instead of using a white light source to generate color, each subpixel component is operatively combined with one of three primary color light sources. More particularly, the array 250 includes a plurality of pixel units 251, each of which is comprised of three subpixel components 252, 254, and 256 having gratings with beam-like elements that are oriented in the same direction. At least three monochromatic light sources 258, 260, and 262 are positioned and trained on the array. The sources and the aperture 264 are coplanar. Each of the three subpixel components (252, 254, and 256) has a different grating period selected to cause light from a particular source (258, 260, and 262 respectively) to be diffracted and directed through the aperture 264 to the viewer when such subpixel component is in its diffraction mode. For example, blue light from a blue source 258 might be diffracted from subpixel component 252 and directed through aperture 264, green light generated by a source 260 might be diffracted from subpixel component 254 through aperture 264, and red light from a source 262 might be diffracted from subpixel component 256 through the opening 264 to the viewer's pupil. This implementation is an improvement over previously described implementations using a white light source and a slit, because fewer grating elements are required to generate color, the dimensions of the grating elements are less critical, the aperture can be significantly larger than the slit and the viewing angle can be widened significantly, for example, at least 3×. Suitable lenses (not shown) could also be used in this embodiment to ensure that the light diffracted and reflected from the array focuses onto the plane of the aperture and that the pixel plane is imaged onto the viewer's retina or onto a projection screen.

It should be noted that in the embodiments of FIGS. 21 through 28 whereas three subpixel components and at least three sources having different colors are needed for generating a full-color pixel unit, only two subpixel components and two light sources are needed to generate a multi-colored pixel, i.e., a pixel that can display a first color, a second color, a third color which is a combination of the first and second colors, or no color.

In operation, data communicated to the device 220 will be received and processed by the module 230 and used to actuate the subpixel grating components in chip 226. Light diffracted from the pixel units of the GLV array will be directed through the aperture 224 to generate an image that can be viewed by the eye of an observer, input to a camera, or projected onto a screen. The image will be full color and can either be static for a fixed or selectable duration, or dynamic in that it changes with time and can even be a video-type image.

Although the actual implementation depicted is a pager-like communications viewer and can alternatively perform in a projection mode, it will be appreciated that the same technique can be employed in a goggle application to provide a display for one or both eyes of a user. Moreover, by using two coordinated units, goggles can be provided for generating three-dimensional video images to create a virtual reality implementation. Quite clearly, such apparatus would also find utility as a viewing device for many remote manipulation, positioning and control applications.

Still another application of the present invention is to use the array of pixel units as a static information storage medium which can be "read out" by either sweeping a trio of colored layer beams across its surface, or by fixing the trio of light sources and moving the storage medium relative thereto, or by using any combination of moving lights and moving media.

Although the present invention has been described above in terms of specific embodiments, it is anticipated that alterations and modifications thereof will no doubt become apparent to those skilled in the art. It is therefore intended that the following claims be interpreted as covering all such alterations and modifications as fall within the true spirit and scope of the invention.

What is claimed is:

1. Display apparatus for generating multi-colored optical images, comprising:

housing means having an optical aperture through which light may be passed; light valve means disposed within said housing means and forming an array of discrete light-modulating pixel units, each including a plurality of subpixel components having elongated grating elements, the grating elements of at least two subpixel components of each pixel unit being oriented such that the grating elements of a first of said two subpixel components extend in a direction different from that of the grating elements of a second of said two subpixel components, each said subpixel component being adapted to selectively have a reflective state and a diffractive state;

means for controlling each said subpixel component by moving selected ones of said grating elements to enable the controlled subpixel component to operate in a reflective state and a diffractive state; and a plurality of colored light sources respectively positioned to illuminate particular subpixel components of each pixel unit of said array such that no light reflected from any of said subpixel components in a reflective state passes through said aperture, but such that light diffracted from corresponding ones of said subpixel components of each said pixel unit in a diffractive state is directed through said aperture.

2. Display apparatus as recited in claim 1 wherein the grating elements of a first of said subpixel components of each said pixel unit have a first orientation and the grating elements of a second of said subpixel components of each said pixel unit have a second orientation which is at 90 degrees relative to the first orientation.

3. Display apparatus as recited in claim 2 wherein each said pixel unit has a third subpixel component, and wherein the grating elements of said third subpixel component of each said pixel unit have an orientation that is neither said first orientation nor said second orientation.

4. Display apparatus as recited in claim 3 wherein the grating periods of the grating elements of the three subpixel components of each pixel unit are equal.

5. Display apparatus as recited in claim 1 wherein the grating elements of the first of said subpixel components of each said pixel unit have a first orientation and a first grating period, wherein the grating elements of the second subpixel component of each said pixel unit have a second orientation which is at 90 degrees relative to the first orientation and said first grating period, and wherein the grating elements of a third subpixel component of each said pixel unit have said first orientation and a second grating period different from said first grating period.

6. Display apparatus as recited in claim 1 wherein the grating elements of the first subpixel component of each said pixel unit have a first angular orientation, wherein the grating elements of the second subpixel component of each said pixel unit have a second angular orientation relative to the grating elements of said first subpixel component, and wherein the grating elements of a third subpixel component of each said pixel unit have a third angular orientation relative to the angular orientations of the grating elements of said first and second subpixel components.

7. Display apparatus as recited in claim 6 wherein said first angular orientation, said second angular orientation and said third angular orientation are respectively separated by angles of 120°.

8. Display apparatus as recited in claim 7 wherein said first, second and third subpixel components each have rhombic perimetric boundaries and are positioned contiguous to each other, such that the collective perimetric boundary of each pixel unit has a generally hexagonal shape.

9. Display apparatus as recited in any one of the claims 1–8 wherein the grating elements of each said subpixel component are arranged parallel to each other, with the light-reflective surfaces of the grating elements normally lying in a first plane, and wherein each said control means includes:
  means for supporting alternative ones of the grating elements in a fixed position; and
  means for moving the remaining grating elements relative to the fixed grating elements and between a first configuration wherein all of the grating elements lie in the first plane and the subpixel component acts to reflect incident light as a plane mirror, and a second configuration wherein said remaining grating elements lie in a second plane parallel to the first plane and the subpixel component diffracts incident light as it is reflected from the planar surfaces of the grating elements.

10. Display apparatus as recited in claim 9 wherein said means for moving said remaining grating elements includes means for applying an electrostatic force to said remaining grating elements.

11. Display apparatus as recited in claim 9 and further comprising electronic communication means for receiving transmitted data and for generating signals for causing certain ones of said subpixel components to assume a reflective state and other ones of said subpixel components to assume a diffractive state.

12. Display apparatus for generating multi-colored optical images, comprising:
  housing means having an optical aperture through which light may be passed;
  light valve means disposed within said housing means and forming an array of discrete light-modulating pixel units each including a plurality of subpixel components having elongated grating elements, the grating elements of at least two subpixel components of each pixel unit being oriented such that the grating elements of a first of said two subpixel components extend in a direction different from that of the grating elements of a second of said two subpixel components, each said subpixel component being adapted to selectively have a reflective state and a diffractive state;
  means for controlling each said subpixel component by moving selected ones of said grating elements to enable the controlled subpixel component to operate in a reflective state and a diffractive state; and
  a plurality of colored light sources respectively positioned to illuminate particular subpixel components of each pixel unit of said array such that no light diffracted from any of said subpixel components in a diffractive state passes through said aperture, but such that light reflected from corresponding ones of said subpixel components of each pixel unit in a reflective state is directed through said aperture.

13. Display apparatus as recited in claim 12 wherein the grating elements of the first of said subpixel components of each said pixel unit have a first orientation and the grating elements of the second of said subpixel components of each said pixel unit have a second orientation which is at 90 degrees relative to the first orientation.

14. Display apparatus as recited in claim 13 wherein each said pixel unit has a third subpixel component, wherein the grating elements of said third subpixel component of each said pixel unit have an orientation that is neither said first orientation nor said second orientation.

15. Display apparatus as recited in claim 14 wherein the grating periods of the grating elements of the three subpixel components of each pixel unit are equal.

16. Display apparatus as recited in claim 12 wherein the grating elements of the first of said subpixel components of each said pixel unit have a first orientation and a first grating period, wherein the grating elements of the second subpixel component of each said pixel unit have a second orientation which is at 90 degrees relative to the first orientation and said first grating period, and wherein the grating elements of a third subpixel component of each said pixel unit have said first orientation and a second grating period different from said first grating period.

17. Display apparatus as recited in claim 12 wherein the grating elements of the first subpixel component of each said pixel unit have a first angular orientation, wherein the grating elements of the second subpixel component of each said pixel unit have a second angular orientation relative to the grating elements of said first subpixel component, and wherein the grating elements of a third subpixel component of each said pixel unit have a third angular orientation relative to the angular orientations of the grating elements of said first and second subpixel components.

18. Display apparatus as recited in claim 17 wherein said first angular orientation, said second angular orientation and said third angular orientation are respectively separated by angles of 120°.

19. Display apparatus as recited in claim 18 wherein said first, second and third subpixel components each have rhombic perimetric boundaries and are positioned contiguous to each other, such that the collective perimetric boundary of each pixel unit has a generally hexagonal shape.

20. Display apparatus as recited in any one of claims 12–19 wherein the grating elements of each said subpixel component are arranged parallel to each other, with the light-reflective surfaces of the grating elements normally lying in a first plane, and wherein each said control means includes:
  means for supporting alternate ones of the grating elements in a fixed position; and
  means for moving the remaining grating elements relative to the fixed grating elements and between a first configuration wherein all of the grating elements lie in the first plane and the subpixel component acts to reflect incident light as a plane mirror, and a second configuration wherein said remaining grating elements lie in a second plane parallel to the first plane and the subpixel component diffracts incident light as it is reflected from the planar surfaces of the grating elements.

21. Display apparatus as recited in claim 20 wherein said means for moving said remaining grating elements includes means for applying an electrostatic force to said remaining grating elements.

22. Display apparatus as recited in claim 20 and further comprising electronic communication means for receiving transmitted data and for generating signals for causing certain ones of said subpixel components to assume a reflective state and other ones of said subpixel components to assume a diffractive state.

23. Apparatus for generative a multi-colored optical image, comprising:

means forming an optical aperture through which light may be passed;

means forming an array of discrete light-modulating pixel units, each including a plurality of subpixel components having elongated grating elements, the grating elements of at least two subpixel components of each said pixel unit being oriented such that the grating elements of a first of said two subpixel components extend in a direction different from that of the grating elements of a second of said two subpixel components, each said subpixel component having a fixed configuration, wherein said component either completely reflects incident light, completely diffracts incident light, or partially diffracts and partially reflects incident light; and a plurality of colored light sources respectively positioned to simultaneously illuminate at least one pixel unit of said array such that no light reflected from any illuminated subpixel component of said one pixel unit in a reflective state passes through said aperture, but such that light diffracted from any illuminated subpixel component of said one pixel unit in a diffractive state is directed through said aperture.

24. Apparatus for generating a multi-colored optical image, comprising:

means forming an optical aperture through which light may be passed;

means forming an array of discrete light-modulating pixel units, each including a plurality of subpixel components having elongated grating elements, the grating elements of at least two subpixel components of each said pixel unit being oriented such that the grating elements of a first of said two subpixel components extend in a direction different from that of the grating elements of a second of said two subpixel components, each said subpixel component having a fixed configuration in either a reflective state or a refractive state, wherein said subpixel component either completely reflects incident light, completely diffracts incident light, or partially diffracts and partially reflects incident light; and a plurality of colored light sources respectively positioned to simultaneously illuminate at least one pixel unit of said array such that no light diffracted from any illuminated subpixel component of said one pixel unit in a diffractive state passes through said aperture, but such that light reflected from any illuminated subpixel component of said one pixel unit in a reflective state is directed through said aperture.

25. Apparatus as recited in claim 23 or 24 wherein the grating elements of the first of said subpixel components of each said pixel unit have a first orientation and the grating elements of the second of said subpixel components of each said pixel unit have a second orientation which is at 90 degrees relative to the first orientation.

26. Apparatus as recited in claim 25 wherein each said pixel unit has a third subpixel component, wherein the grating elements of said third subpixel component of each said pixel unit have an orientation that is neither said first orientation nor said second orientation.

27. Apparatus as recited in claim 26 wherein the grating periods of the grating elements of the three subpixel components of each pixel unit are equal.

28. Apparatus as recited in claim 23 or 24 wherein the grating elements of the first of said subpixel components of each said pixel unit have a first orientation and a first grating period, wherein the grating elements of the second subpixel component of each said pixel unit have a second orientation which is at 90 degrees relative to the first orientation and said first grating period, and wherein the grating elements of a third subpixel component of each said pixel unit have said first orientation and a second grating period different from said first grating period.

29. Display apparatus as recited in claim 23 or 24 wherein the grating elements of the first subpixel component of each said pixel unit have a first angular orientation, wherein the grating elements of the second subpixel component of each said pixel unit have a second angular orientation relative to the grating elements of said first subpixel component, and wherein the grating elements of a third subpixel component of each said pixel unit have a third angular orientation relative to the angular orientations of the grating elements of said first and second subpixel components.

30. Display apparatus as recited in claim 29 wherein said first angular orientation, said second angular orientation and said third angular orientation are respectively separated by angles of 120°.

31. Display apparatus as recited in claim 30 wherein said first, second and third subpixel components each have rhombic perimetric boundaries and are positioned contiguous to each other, such that the collective perimetric boundary of each pixel unit has a generally hexagonal shape.

32. A method of generating multi-colored optical images, comprising the steps of:

providing an optical aperture through which light may be passed;

forming an array of discrete light-modulating pixel units, each including a plurality of subpixel components having elongated grating elements, the grating elements of at least two subpixel components of each pixel unit being oriented such that the grating elements of a first of said two subpixel components extend in a direction different from that of the grating elements of a second of said two subpixel components, each said subpixel component being adapted to selectively have a reflective state and a diffractive state, and including means for controlling each said subpixel component by moving selected ones of said grating elements to enable the controlled subpixel component to operate in a reflective state and a diffractive state;

causing each said subpixel component to assume either said reflective state or said diffractive state; and positioning a plurality of colored light sources to respectively illuminate particular subpixel components of each pixel unit of said array such that no light reflected from any of said subpixel components in a reflective state passes through said aperture, but such that light diffracted from subpixel components in a diffractive state is directed through said aperture, whereby an optical image corresponding to the states of said pixel units is viewable through said optical aperture.

33. A method as recited in claim 32 including causing the grating elements of the first of said subpixel components of each said pixel unit to have a first orientation and causing the grating elements of the second of said subpixel components of each said pixel unit to have a second orientation which is at 90 degrees relative to the first orientation.

34. A method as recited in claim 33 including causing each said pixel unit to have a third subpixel component, and causing the grating elements of said third subpixel component of each said pixel unit to have an orientation that is different from the orientations of said first and second subpixel components.

35. A method as recited in claim 34 and further including causing the grating periods of the grating elements of the three subpixel components of each pixel unit to be equal.

36. A method as recited in claim 32 including causing the grating elements of the first of said subpixel components of each said pixel unit to have a first orientation and a first grating period, causing the grating elements of the second subpixel component of each said pixel unit to have a second orientation which is at 90 degrees relative to the first orientation and said first grating period, and causing the grating elements of a third subpixel component of each said pixel unit to have said first orientation and a second grating period different from said first grating period.

37. A method as recited in claim 32 including causing the grating elements of the first subpixel component of each said pixel unit to have a first angular orientation, causing the grating elements of the second subpixel component of each said pixel unit to have a second angular orientation relative to the grating elements of said first subpixel component, and causing the grating elements of a third subpixel component of each said pixel unit to have a third angular orientation relative to the angular orientations of the grating elements of said first and second subpixel components.

38. A method as recited in claim 37 wherein said first angular orientation, said second angular orientation and said third angular orientation are respectively separated by angles of 120°.

39. A method as recited in claim 38 and further including causing said first, second and third subpixel components to each have rhombic perimetric boundaries and to be positioned contiguous to each other, such that the collective perimetric boundary of each pixel unit has a generally hexagonal shape.

40. A method for generating multi-colored optical images, comprising the steps of:

providing a housing means having an optical aperture through which light may be passed;

providing a light valve means disposed within said housing means and forming an array of discrete light-modulating pixel units, each including a plurality of subpixel components having elongated grating elements, the grating elements of at least two subpixel components of each pixel unit being oriented such that the grating elements of a first of said two subpixel components extend in a direction different from that of the grating elements of a second of said two subpixel components, each said subpixel component being adapted to selectively have a reflective state and a diffractive state, and including means for controlling each said subpixel component by moving selected ones of said grating elements to enable the controlled subpixel component to operate in a reflective state and a diffractive state; and positioning a plurality of colored light sources to respectively illuminate particular subpixel components of each pixel unit of said array such that no light reflected from any of said subpixel components in a reflective state passes through said aperture, but such that light diffracted from corresponding ones of said subpixel components of each said pixel unit in a diffractive state is directed through said aperture.

41. A method as recited in any one of claims 32–40 wherein the grating elements of each said subpixel component are arranged parallel to each other, with the light-reflective surfaces of the grating elements normally lying in a first plane, and further including supporting alternate ones of the grating elements in a fixed position, and moving the remaining grating elements relative to the fixed grating elements and between a first configuration wherein all of the grating elements lie in the first plane and the subpixel component acts to reflect incident light as a plane mirror, and a second configuration wherein said remaining grating elements lie in a second plane parallel to the first plane and the subpixel component diffracts incident light as it is reflected from the planar surfaces of the grating elements.

42. A method of generating multi-colored optical images, comprising the steps of:

providing an optical aperture through which light may be passed;

forming an array of discrete light-modulating pixel units, each including a plurality of subpixel components having elongated grating elements, the grating elements of at least two subpixel components of each pixel unit being oriented such that the grating elements of a first of said two subpixel components extend in a direction different from that of the grating elements of a second of said two subpixel components, each said subpixel component being adapted to selectively have a reflective area and a diffractive state, and including means for controlling each said subpixel component by moving selected ones of said grating elements to enable the controlled subpixel component to operate in a reflective state and a diffractive state;

causing each said subpixel component to assume either said reflective state or said diffractive state; and positioning a plurality of colored light sources to respectively illuminate particular subpixel components of each pixel unit of said array such that no light diffracted from any of said subpixel components in a diffractive state passes through said aperture, but such that light reflected from subpixel components in a reflective state is directed through said aperture, whereby an optical image corresponding to the states of said pixel units is viewable through said optical aperture.

43. A method as recited in claim 42 including causing the grating elements of the first of said subpixel components of each said pixel to have a first orientation and causing the grating elements of the second of said subpixel components of each said pixel unit to have a second orientation which is at 90 degrees relative to the first orientation.

44. A method as recited in claim 43 including causing each said pixel unit to have a third subpixel component, and causing the grating elements of said third subpixel component of each said pixel unit to have an orientation that is different from the orientations of said first and second subpixel components.

45. A method as recited in claim 44 and further including causing the grating periods of the grating elements of the three subpixel components of each pixel unit to be equal.

46. A method as recited in claim 42 including causing the grating elements of the first of said subpixel components of each said pixel unit to have a first orientation and a first grating period, causing the grating elements of the second subpixel component of each said pixel unit to have a second orientation which is at 90 degrees relative to the first orientation and said first grating period, and causing the grating elements of a third subpixel component of each said pixel unit to have said first orientation and a second grating period different from said first grating period.

47. A method as recited in claim 42 including causing the grating elements of the first subpixel component of each said pixel unit to have a first angular orientation, causing the grating elements of the second subpixel component of each said pixel unit to have a second angular orientation relative to the grating elements of said first subpixel component, and causing the grating elements of a third subpixel component of each said pixel unit to have a third angular orientation relative to the angular orientations of the grating elements of said first and second subpixel components.

48. A method as recited in claim 47 wherein said first angular orientation, said second angular orientation and said third orientation are respectively separated by angles of 120 degrees.

49. A method as recited in claim 48 and further including causing said first, second and third subpixel components to each have rhombic perimetric boundaries and to be positioned contiguous to each other, such that the collective perimetric boundary of each pixel unit has a generally hexagonal shape.

50. A method for generating multi-colored optical images, comprising the steps of:
  providing a housing means having an optical aperture through which light may be passed;
  disposing a light valve means within said housing means and forming an array of discrete light-modulating pixel units, each including a plurality of subpixel components having elongated grating elements, the grating elements of at least two subpixel components of each pixel unit being oriented such that the grating elements, the grating elements of a first of said two subpixel components extend in a direction different from that of the grating elements of a second of said two subpixel components, each said subpixel component being adapted to selectively have a reflective state and a diffractive state, and including means for controlling each said subpixel component by moving selected ones of said grating elements to enable the controlled subpixel component to operate in a reflective state and a diffractive state; and
  positioning a plurality of colored light sources to respectively illuminate particular subpixel components of each pixel unit of said array such that no light diffracted from any of said subpixel components in a diffractive state passes through said aperture, but such that light reflected from corresponding ones of said subpixel components of each said pixel unit in a reflective state is directed through said aperture.

51. A method as recited in any one of claims 42–50 wherein the grating elements of each said subpixel component are arranged parallel to each other, with the light-reflective surfaces of the grating elements normally lying in a first plane, and further including
  supporting alternate ones of the grating elements in a fixed position, and
  moving the remaining grating elements relative to the fixed grating elements and between a first configuration wherein all of the grating elements lie in a first plane and the subpixel component acts to reflect incident light as a plane mirror, and a second configuration wherein said remaining grating elements lie in a second plane parallel to the first plane and the subpixel component diffracts incident light as it is reflected from the planar surfaces of the grating elements.

52. Display apparatus for generating multi-colored optical images, comprising:
  means forming an optical aperture through which light may be passed;
  light valve means disposed with a predetermined relationship to said aperture and consisting of an array of discrete light-modulating pixel units, each including at least two subpixel components having elongated grating elements, each said subpixel component being adapted to selectively have a reflective state and a diffractive state;
  means for controlling each said subpixel component by moving selected ones of said grating elements to enable the controlled subpixel component to operate in a reflective state and a diffractive state; and
  at least two different colored light sources positions to illuminate the pixel units of said array,
  the apparatus being characterized in that the grating elements of each subpixel component of each pixel unit selectively cause light from a particular source to be diffracted and directed through said aperture when in said diffractive state or to be reflected away from said aperture when in said reflective state.

53. Display apparatus for generating multi-colored optical images, comprising:
  means forming an optical aperture through which light may be passed;
  light valve means disposed with a predetermined relationship to said aperture and consisting of an array of discrete light-modulating pixel units, each including at least two subpixel components having elongated grating elements, each said subpixel component being adapted to selectively have a reflective state and a diffractive state;
  means for controlling each said subpixel component by moving selected ones of said grating elements to enable the controlled subpixel component to operate in a reflective state and a diffractive state; and
  at least two different colored light sources positioned to illuminate the pixel units of said array,
  the apparatus being characterized in that the grating elements of each subpixel component of each pixel unit selectively cause light from a particular source to be reflected through said aperture when in said reflective state or to be diffracted and directed away from said aperture when in said diffractive state.

54. Display apparatus for generating multi-colored optical images, comprising:
  means forming an optical aperture through which light may be passed;
  light valve means disposed with a predetermined relationship to said aperture and consisting of an array of discrete light-modulating pixel units, each including at least two subpixel components having elongated grating elements, each said subpixel component being configured to have either a reflective state or a diffractive state;
  means for controlling each said subpixel component by moving selected ones of said grating elements to enable the controlled subpixel component to operate in a reflective state and a diffractive state; and
  at least two different colored light sources positioned to illuminate the pixel units of said array,
  the apparatus being characterized in that the grating elements of each subpixel component of each pixel unit having said diffractive state cause light from a particular source to be diffracted and directed through said aperture and subpixel components having said reflective state cause light from the particular source to be reflected away from said aperture.

55. Display apparatus as recited in any one of claims 52–54 wherein the grating elements of each subpixel component extend in a different direction relative to the grating elements of the other subpixel components of the same pixel unit.

56. Display apparatus as recited in any one of claims 52–54 wherein the subpixel components of each pixel unit have different grating periods.

* * * * *